United States Patent
Liaw

(10) Patent No.: US 9,218,872 B1
(45) Date of Patent: Dec. 22, 2015

(54) MEMORY CHIP AND LAYOUT DESIGN FOR MANUFACTURING SAME

(71) Applicant: TAIWAN SEMICONDUCTOR MANUFACTURING COMPANY, LTD., Hsinchu (TW)

(72) Inventor: Jhon Jhy Liaw, Zhubdong Township (TW)

(73) Assignee: TAIWAN SEMICONDUCTOR MANUFACTRUING COMPANY, LTD. (TW)

( * ) Notice: Subject to any disclaimer, the term of this patent is extended or adjusted under 35 U.S.C. 154(b) by 0 days.

(21) Appl. No.: 14/310,399

(22) Filed: Jun. 20, 2014

(51) Int. Cl.
  *G11C 11/34* (2006.01)
  *G11C 11/41* (2006.01)
  *G11C 11/419* (2006.01)

(52) U.S. Cl.
  CPC .............. *G11C 11/41* (2013.01); *G11C 11/419* (2013.01)

(58) Field of Classification Search
  CPC ..... G11C 11/412; G11C 11/419; G11C 5/147
  USPC ............................................................. 365/154
  See application file for complete search history.

(56) References Cited

U.S. PATENT DOCUMENTS

| | | | |
|---|---|---|---|
| 2006/0262628 A1* | 11/2006 | Nii et al. | 365/226 |
| 2009/0207675 A1* | 8/2009 | Kengeri et al. | 365/189.14 |
| 2012/0113708 A1* | 5/2012 | Jung et al. | 365/154 |
| 2013/0141962 A1* | 6/2013 | Liaw | 365/154 |

* cited by examiner

*Primary Examiner* — Douglas King
(74) *Attorney, Agent, or Firm* — Hauptman Ham, LLP

(57) ABSTRACT

An embedded synchronous random access memory (SRAM) chip, includes a first single-port (SP) SRAM macro and a second SP macro. The first macro includes a first periphery circuit, and a plurality of first SRAM cells. The second macro includes a second periphery circuit, and a plurality of second SRAM cells. Further, each cell of the plurality of first SRAM cells is electrically connected to a write-assist circuitry, wherein the write assist circuitry is configured to assist the write cycle capability of each cell of the plurality of first SRAM cells. Further, each cell of the plurality of second SRAM cells do not include write assist circuitry.

20 Claims, 16 Drawing Sheets

Single-port cell-1
1. First cell (SP-1) - fully single FinFET MOSFET w/ first power
2. 1st Vdd for SP-1 CVdd and WL decoder/driver on active mode (read/write cycle) operation voltage
3. Vdd_Lo1 for SP-1 standby mode voltage
4. 3rd Vdd for SP-1 write-driver (Bit-line voltage) voltage metal routing embodiment 1:
(1) CVdd, BL, BLB located at first metal layer
(2) WL, Vss lines located at second metal layer
(3) Second metal layer located upon first metal layer metal routing embodiment 2:
(1) Word line located at first metal layer
(2) CVdd, BL, BLB, Vss lines located at second metal layer
(3) Second metal layer located upon first metal layer

MEMORY CHIP AND LAYOUT DESIGN FOR MANUFACTURING SAME

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. As ICs have become smaller and more complex, the effects of cross-talk and wiring resistance further affect IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
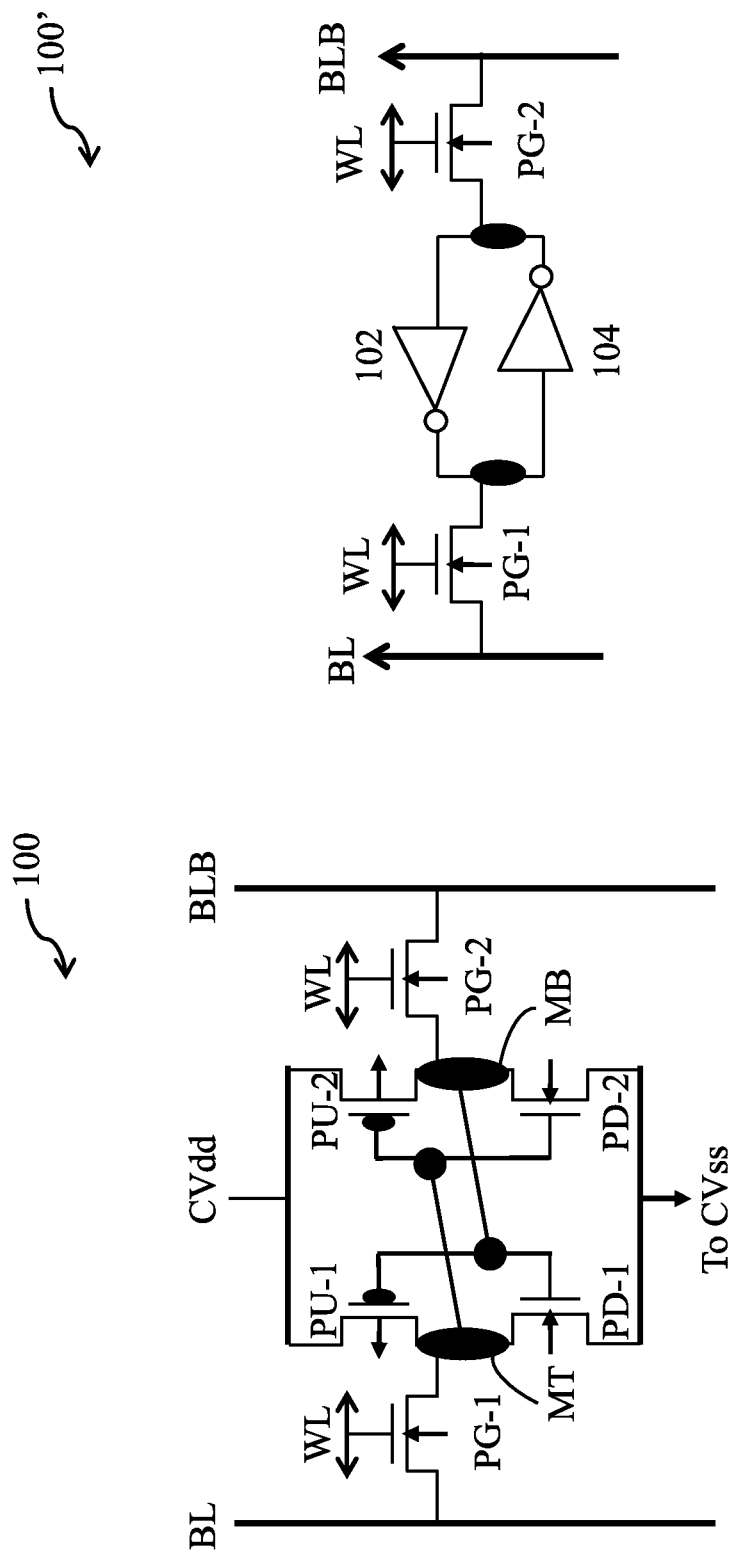
FIG. 1A is a schematic diagram of a memory cell in accordance with one or more embodiments.
FIG. 1B is a schematic diagram of a memory cell in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic diagram of a memory cell 100 in accordance with one or more embodiments. In some embodiments, memory cell 100 is a portion of one or more single port (SP) static random access memory (SRAM) cells. In some embodiments, memory cell 100 is a portion of an embedded SRAM memory cell array. In some embodiments, write ports or read ports are a part of memory cell 100. In some embodiments, additional write ports and/or read ports are a part of memory cell 100. In some embodiments, memory cell 100 employs a number of transistors other than six. In some embodiments, memory cell 100 is usable in a memory cell array. The schematic diagram of memory cell 100 is a basis to be modified to form other structures, such as those described herein, e.g., FIGS. 1B, 2A-2B, 3A-3B, 4, 5A, 6A, 7A-7B 8A-8B and 9A-9B. In some embodiments, memory cell 100 is usable as a unit cell in memory cell array 402 shown in FIG. 4. In some embodiments, memory cell 100 is usable as a unit cell in memory cell array 702 shown in FIG. 7A. In some embodiments, memory cell 100 is usable as a unit cell in memory cell array 702 shown in FIG. 7B.

Memory cell 100 includes cross-coupled inverter 102 (shown in FIG. 1B) connected to n-type metal oxide semiconductor (NMOS) transistor PG-1 and cross-coupled inverter 104 (shown in FIG. 1B) connected to NMOS transistor PG-2. In some embodiments, cross-coupled inverters 102 and 104 form a storage unit. In some embodiments, memory cell 100 includes three-dimensional gate structures, e.g., fin field-effect-transistors (FinFET). In some embodiments, memory cell 100 is a portion of a 3-Dimensional (3D) structure enabling ultra-high density integration at the individual transistor-level. In a 3D IC, each of the device layers is fabricated sequentially and is stacked upon the preceding layer.

The cross-coupled inverter 102 includes p-type metal oxide semiconductor (PMOS) transistor PU-1 and NMOS transistor PD-1. The cross-coupled inverter 104 includes PMOS transistor PU-2 and NMOS transistor PD-2.

The source terminal of each PMOS transistor PU-1, PU-2 is electrically connected to a power supply voltage (CVDD) terminal. The drain terminal of each PMOS transistor PU-1, PU-2 is separately electrically connected to the drain terminal of each NMOS transistor PD-1, PD-2 at corresponding nodes MT and MB. A gate terminal of PMOS transistor PU-1 is electrically connected to a gate terminal of NMOS transistor PD-1 and the drain terminal of NMOS transistor PD-2. Similarly, a gate terminal of PMOS transistor PU-2 is electrically connected to a gate terminal of NMOS transistor PD-2 and the drain terminal of NMOS transistor PD-1. The source terminal of NMOS transistors PD-1 and PD-2 is electrically connected to a ground reference node CVSS. In some embodiments, ground reference node CVSS corresponds to a ground voltage.

In some embodiments, PMOS transistors PU-1 and PU-2 are referred to as pull-up (PU) devices. In some embodiments, NMOS transistors PD-1 and PD-2 are referred to as pull-down (PD) devices. In some embodiments, NMOS transistors PG-1 and PG-2 are referred to as pass-gate (PG) devices.

NMOS transistor PG-1 is configured to selectively connect cross-coupled inverters 102 and 104 to a first bit line BL. In some embodiments, NMOS transistor PG-1 is connected between first bit line BL and reference node MT. The gate of NMOS transistor PG-1 is connected to the first word line WL. Both NMOS transistor PG-1 and NMOS transistor PG-2 are configured to be activated based on a signal supplied by a word line WL.

NMOS transistor PG-2 is configured to selectively connect cross-coupled inverters 102 and 104 to a first bit line bar BLB. In some embodiments, NMOS transistor PG-2 is connected between first bit line bar BLB and reference node MB. The gate of NMOS transistor PG-2 is connected to the word line WL. Note that the term "bar" as used in this context indicates a logically inverted signal.

In some embodiments, memory cell 100 is a fully-single fin cell (e.g., each of NMOS transistors PD-1, PD-2, PG-1 and PG-2, and PMOS transistors PU-1 and PU-2 are single fin transistor devices). In some embodiments, memory cell 100 is a multiple-fin cell (e.g., each of NMOS transistors PD-1, PD-2, PG-1 and PG-2 are multiple-fin transistor devices). In some embodiments, a multiple-fin transistor device is a transistor device which includes more than one fin device.

In some embodiments, in a high-density memory cell, each of the transistor devices in memory cell 100 are fully-single fin cells. In some embodiments, in a high-density memory cell one or more write assist circuits are utilized to improve the Vcc_min of each transistor in the memory cell.

In some embodiments, in a high-stability memory cell, each of the NMOS transistors PD-1, PD-2, PG-1 and PG-2 in memory cell 100 are multiple-fin cells and the PMOS transistors PU-1 and PU-2 are single fin cells. In some embodiments, in a high-stability memory cell no write assist circuitry is utilized to improve the Vcc_min of each transistor in the memory cell.

In some embodiments, memory cell 100 is a portion of a single SRAM memory chip. In some embodiments, one or more single fin type cells and one or more multiple-fin type cells are formed in a single SRAM memory chip. In some embodiments, a single SRAM chip includes an embedded SRAM memory cell array. In some embodiments, a single SRAM memory chip includes an embedded SRAM memory cell array and a write assist circuit, where at least a portion of the embedded SRAM memory cell array is electrically connected to the write assist circuit.

FIG. 1B is a schematic diagram of a memory cell 100' in accordance with one or more embodiments. Memory cell 100' is an embodiment of the memory cell 100 (shown in FIG. 1A) with similar elements. As shown in FIG. 1B, similar elements have a same reference number as shown in FIG. 1A. In comparison with memory cell 100 (shown in FIG. 1A), memory cell 100' includes cross-coupled inverters 102 and 104. Memory cell 100' is an equivalent circuit for memory cell 100. Cross-coupled inverter 102 is an equivalent circuit for PMOS transistor PU-1 and NMOS transistor PD-1. Cross-coupled inverter 104 is an equivalent circuit for PMOS transistor PU-2 and NMOS transistor PD-2.

Figure 2A:
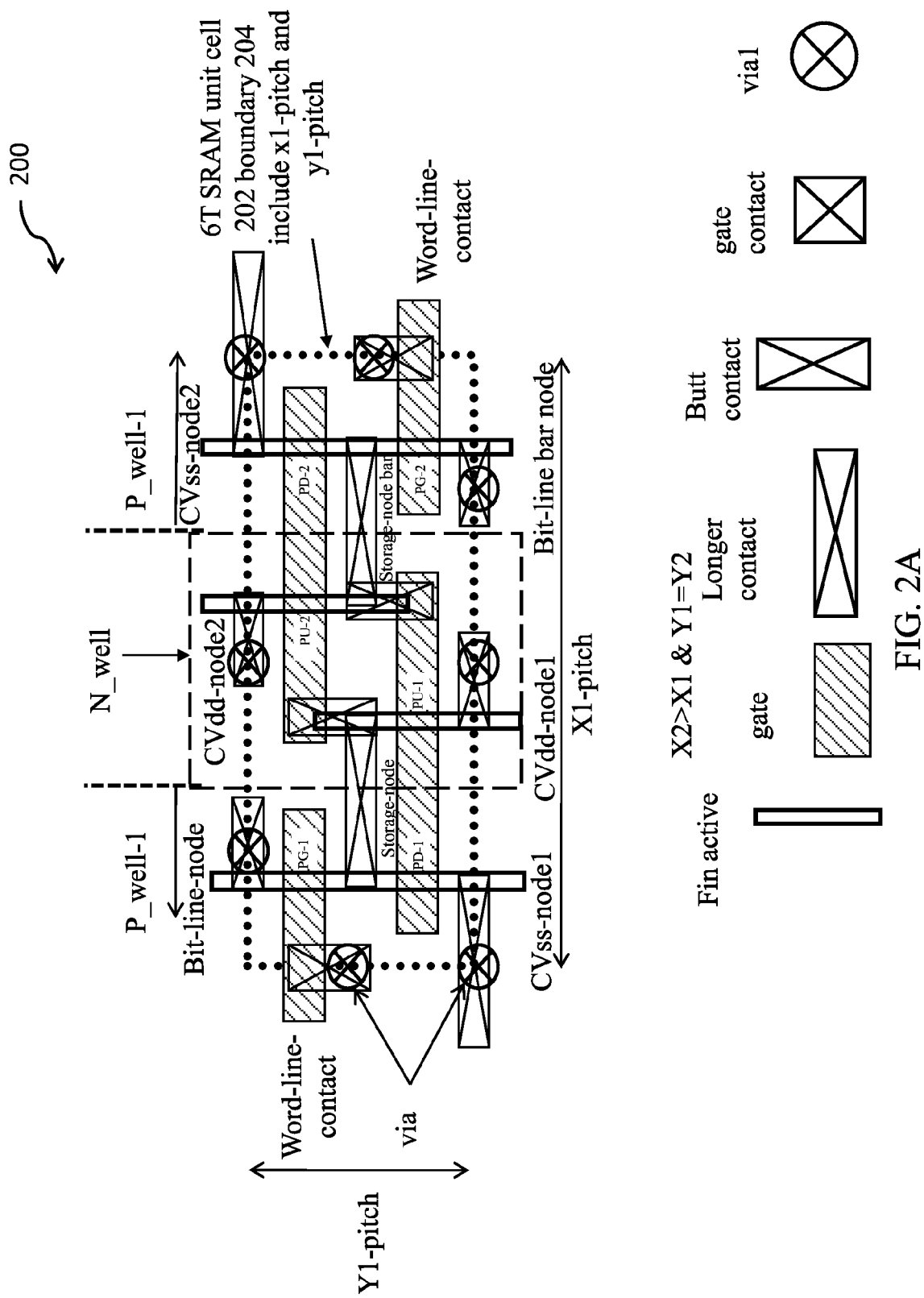
FIG. 2A is a portion of a layout diagram of the memory cell in FIG. 1A in accordance with one or more embodiments.

FIG. 2A is a portion of a layout diagram 200 of the memory cell 100 in FIG. 1A in accordance with one or more embodiments. The components of the layout diagram 200 shown in FIG. 2A are the same or are similar to those depicted in FIGS. 1A-1B with the same reference number, and the detailed description thereof is omitted. While layout diagram 200 illustrates vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

Layout diagram 200 is an embodiment of a single-fin memory cell. Layout diagram 200 includes an N-well region N_well, and P-Well regions P_Well1 and P_well-1. A cell boundary 204 defines a unit cell 202. Unit cell 202 comprises transistor devices PU-1, PU-2, PD-1, PD-2, PG-1 and PG-2. In some embodiments, the unit cell 202 is a 6 transistor (6T) configuration. In some embodiments, the shape of the unit cell 202 is a rectangular cell shape. The unit cell 202 comprises a first X-pitch X1 and a first Y-pitch Y1. In some embodiments, unit cell 202 is a single-fin memory cell configured to be connected to a write assist circuitry.

The PD transistors (e.g., PD-1 and PD-2) of layout 200 shown in FIG. 2A comprises a first channel width (fin width-1). The PD transistors (e.g., PD-1 and PD-2) of layout 200' shown in FIG. 2B comprises a second channel width (fin width-2). In some embodiments, the first channel width (fin width-1) is wider than the second channel width (fin width-2) by at least 10%.

Figure 2B:
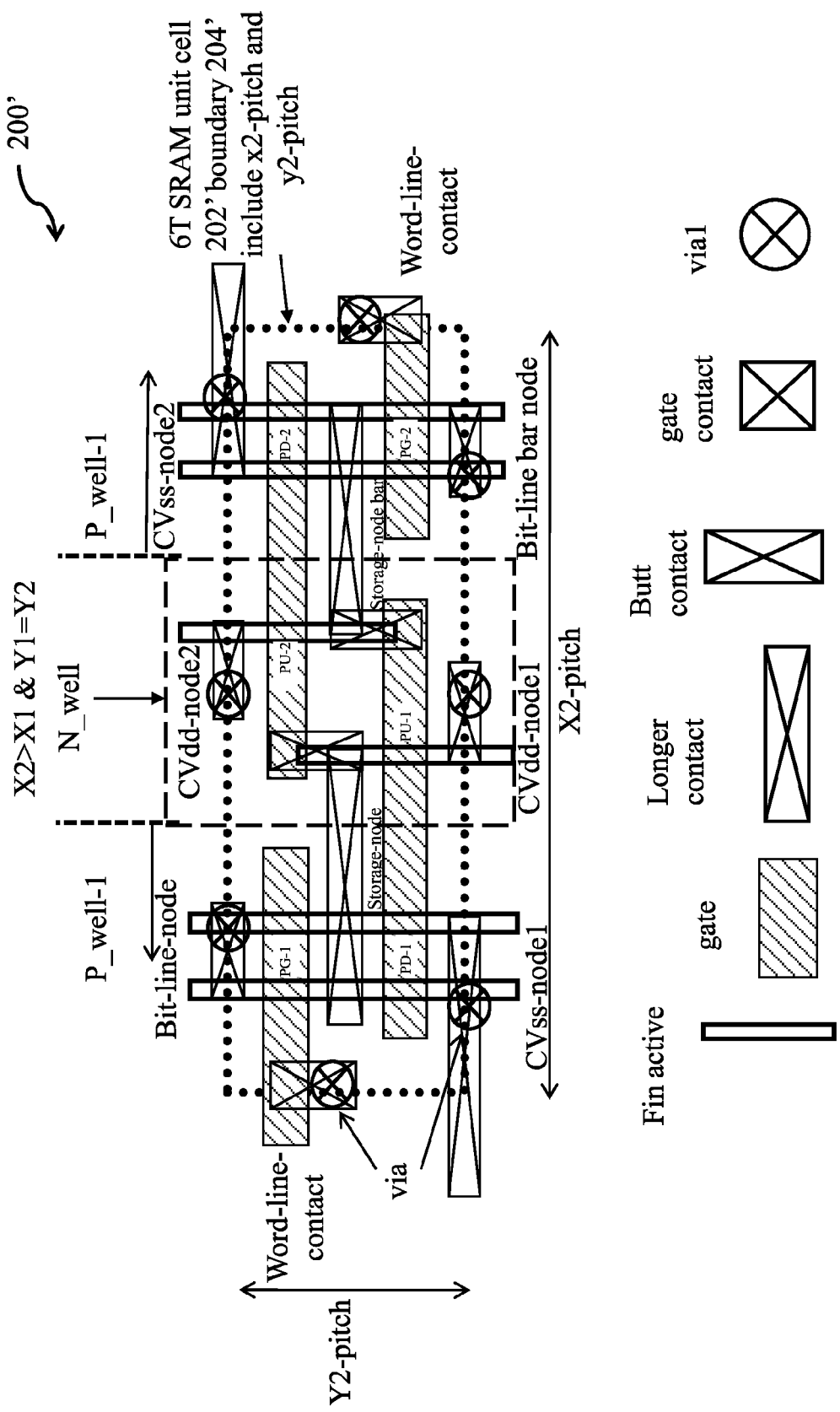
FIG. 2B is a portion of a layout diagram of the memory cell in FIG. 1A in accordance with one or more embodiments.

FIG. 2B is a portion of a layout diagram 200' of the memory cell 100 in FIG. 1A in accordance with one or more embodiments. The components of the layout diagram 200' shown in FIG. 2B are the same or are similar to those depicted in FIGS. 1A-1B with the same reference number, and the detailed description thereof is omitted. While layout diagram 200' illustrates vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

Layout diagram 200' is an embodiment of a hybrid multiple-fin/single fin memory cell. For example, as shown in FIG. 2B, transistor devices PU-1 and PU-2 are single fin transistor devices, and transistor devices PD-1, PD-2, PG-1 and PG-2 are multiple-fin transistor devices.

Layout diagram 200' includes an N-well region N_well, and P-Well regions P_Well-1 and P_well-1. A cell boundary 204' defines a unit cell 202'. Unit cell 202' comprises transistor devices PU-1, PU-2, PD-1, PD-2, PG-1 and PG-2. In some embodiments, the unit cell 202' is a 6T configuration. In some embodiments, the shape of the unit cell 202' is a rectangular cell shape. The unit cell 202' comprises a second X-pitch X2 and a second Y-pitch Y2. In some embodiments, the second X-pitch X2 is greater than the first X-pitch X1. In some embodiments, the first Y-pitch Y1 is substantially equal to the second Y-pitch Y2. In some embodiments, unit cell 202' includes a multiple-fin/single fin hybrid memory cell configured to not be connected to a write assist circuitry. In some embodiments, the cell pitch ratio of X2 to Y1 (X2/Y1) is substantially equal to 2.8. In some embodiments, a length ratio of X2 to X1 (X2/X1) is substantially equal to 1.235.

In some embodiments, transistor device PD-1 comprises at least two transistor devices connected in parallel, such that the source terminals for each transistor are connected together, the drain terminals for each transistor are connected together, and the gate terminals for each transistor are connected together.

In some embodiments, transistor device PD-2 comprises at least two transistor devices connected in parallel, such that the source terminals for each transistor are connected together, the drain terminals for each transistor are connected together, and the gate terminals for each transistor are connected together.

In some embodiments, transistor device PG-1 comprises at least two transistor devices connected in parallel, such that the source terminals for each transistor are connected together, the drain terminals for each transistor are connected together, and the gate terminals for each transistor are connected together.

In some embodiments, transistor device PG-2 comprises at least two transistor devices connected in parallel, such that the source terminals for each transistor are connected together, the drain terminals for each transistor are connected together, and the gate terminals for each transistor are connected together.

Figure 3A:
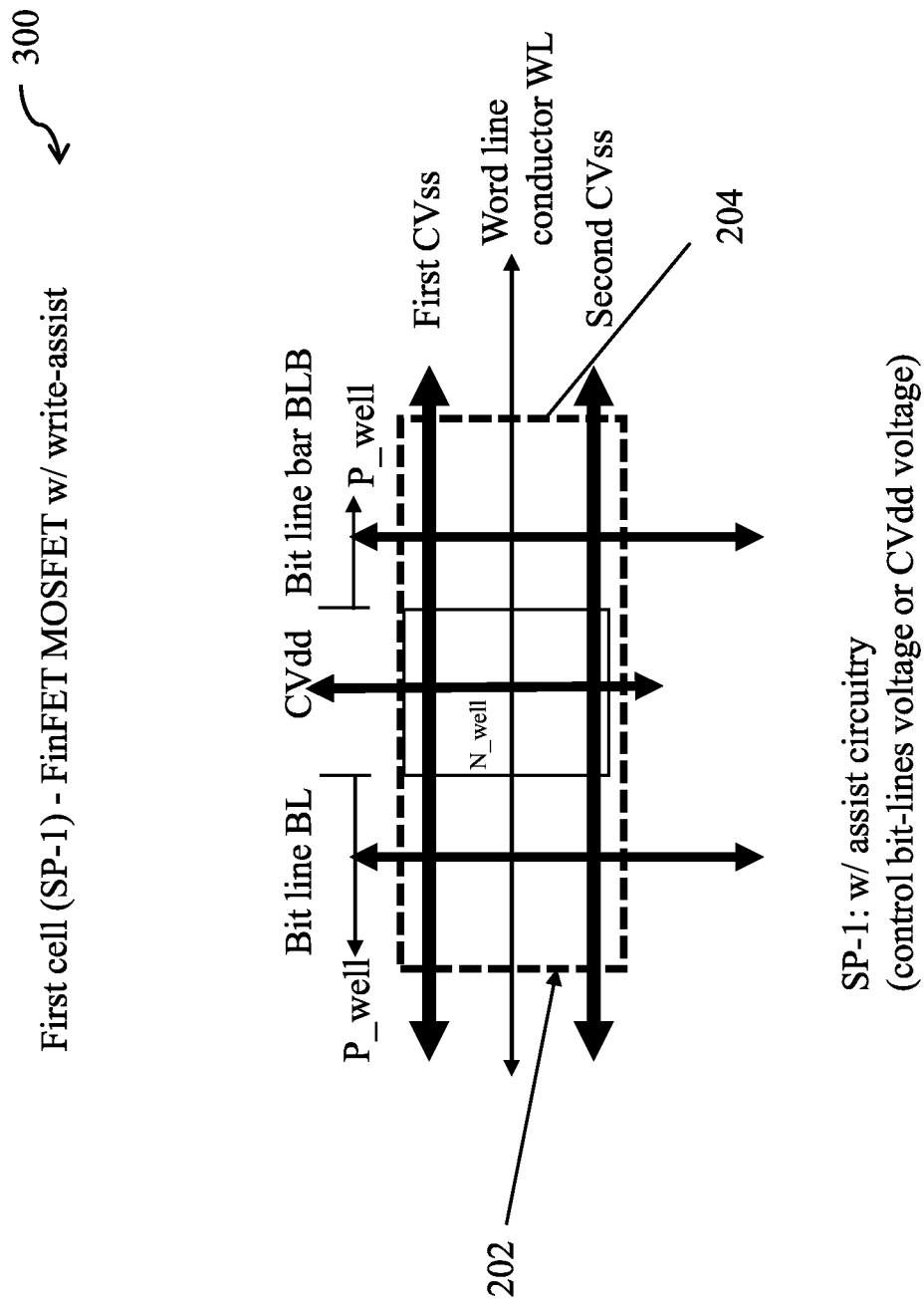
FIG. 3A is a portion of a layout diagram of the memory cell in FIG. 2A in accordance with one or more embodiments.

FIG. 3A is a portion of a layout diagram 300 of the memory cell in FIG. 2A in accordance with one or more embodiments. Layout diagram 300 is an embodiment of layout diagram 200 (shown in FIG. 2A) with similar elements. As shown in FIG. 3A, similar elements have a same reference number as shown in FIG. 2A.

Layout diagram 300 includes unit cell 202 and conductive lines (e.g., voltage reference CVDD, bit line BL, bit line bar BLB, word line conductor WL, first ground reference node first CVSS and second ground reference node second CVSS).

In some embodiments, one or more metal layers are utilized to electrically connect one or more of the conductive lines to the unit cell 202. In some embodiments, if more than one metal layer is utilized, a subsequent metal layer is stacked above a preceding metal layer. In some embodiments, two or more conductive lines are located on a same metal layer as each other. In some embodiments, one or more conductive lines are located on a different metal layer as each other.

In some embodiments, voltage reference CVDD, bit line BL and bit line bar BLB are located on a first metal layer. In some embodiments, voltage reference CVDD, bit line BL and bit line bar BLB are located on a common metal layer. In some embodiments, word line conductor WL, first ground reference node first CVSS and second ground reference node second CVSS are located on a second metal layer. In some embodiments, word line conductor WL, first ground reference node first CVSS and second ground reference node second CVSS are located on a common metal layer. In some embodiments, the second metal layer is located above the first metal layer. In some embodiments, the layout diagram 300 includes a third metal layer. In some embodiments, the third metal layer is located above the second metal layer.

Figure 3B:
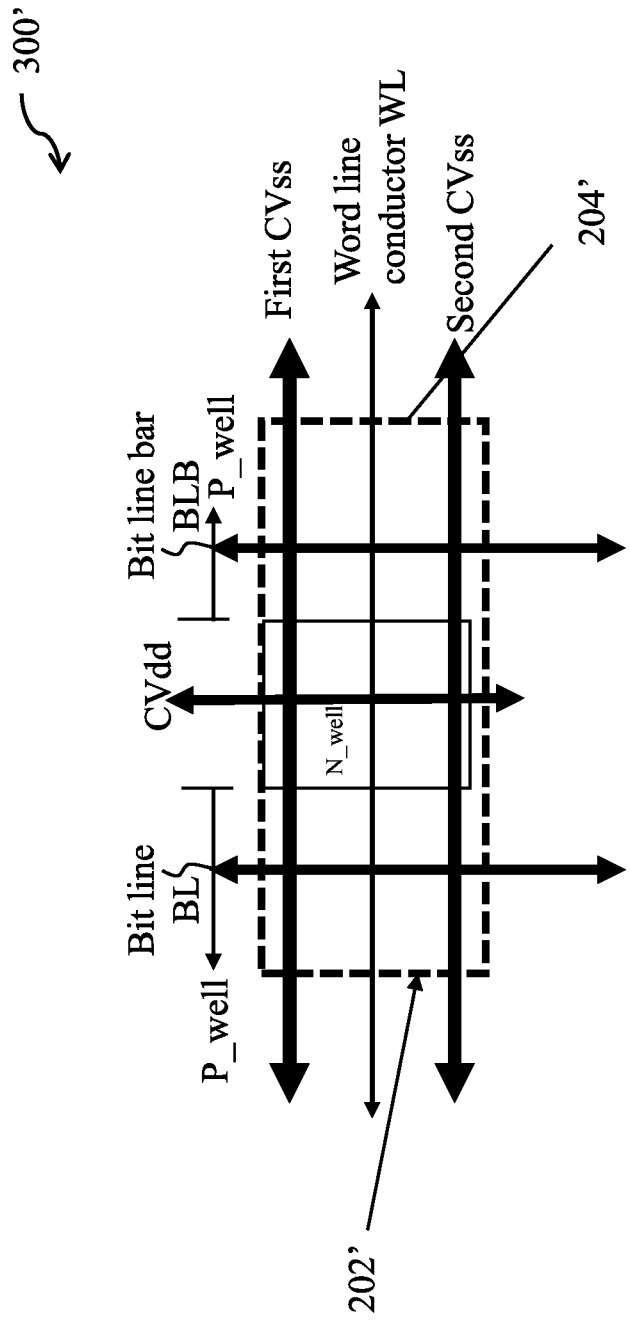
FIG. 3B is a portion of a layout diagram of the memory cell in FIG. 2B in accordance with one or more embodiments.

FIG. 3B is a portion of a layout diagram 300' of the memory cell in FIG. 2B in accordance with one or more embodiments. Layout diagram 300' is an embodiment of layout diagram 200' (shown in FIG. 2B) with similar elements. As shown in FIG. 3B, similar elements have a same reference number as shown in FIG. 2B.

Layout diagram 300' includes unit cell 202' and conductive lines (e.g., voltage reference CVDD, bit line BL, bit line bar BLB, word line conductor WL, first ground reference node first CVSS and second ground reference node second CVSS).

In some embodiments, one or more metal layers are utilized to electrically connect one or more of the conductive lines to the unit cell 202'. In some embodiments, if more than one metal layer is utilized, a subsequent metal layer is stacked above a preceding metal layer. In some embodiments, two or more conductive lines are formed on a same metal layer as each other. In some embodiments, one or more conductive lines are formed on a different metal layer as each other.

In some embodiments, layout diagram 300' further comprises a third ground reference node third CVSS (not shown) located against cell boundary 204', and shared with an adjacent cell (not shown). A cell boundary is the region between two adjacent memory cells.

Figure 4:
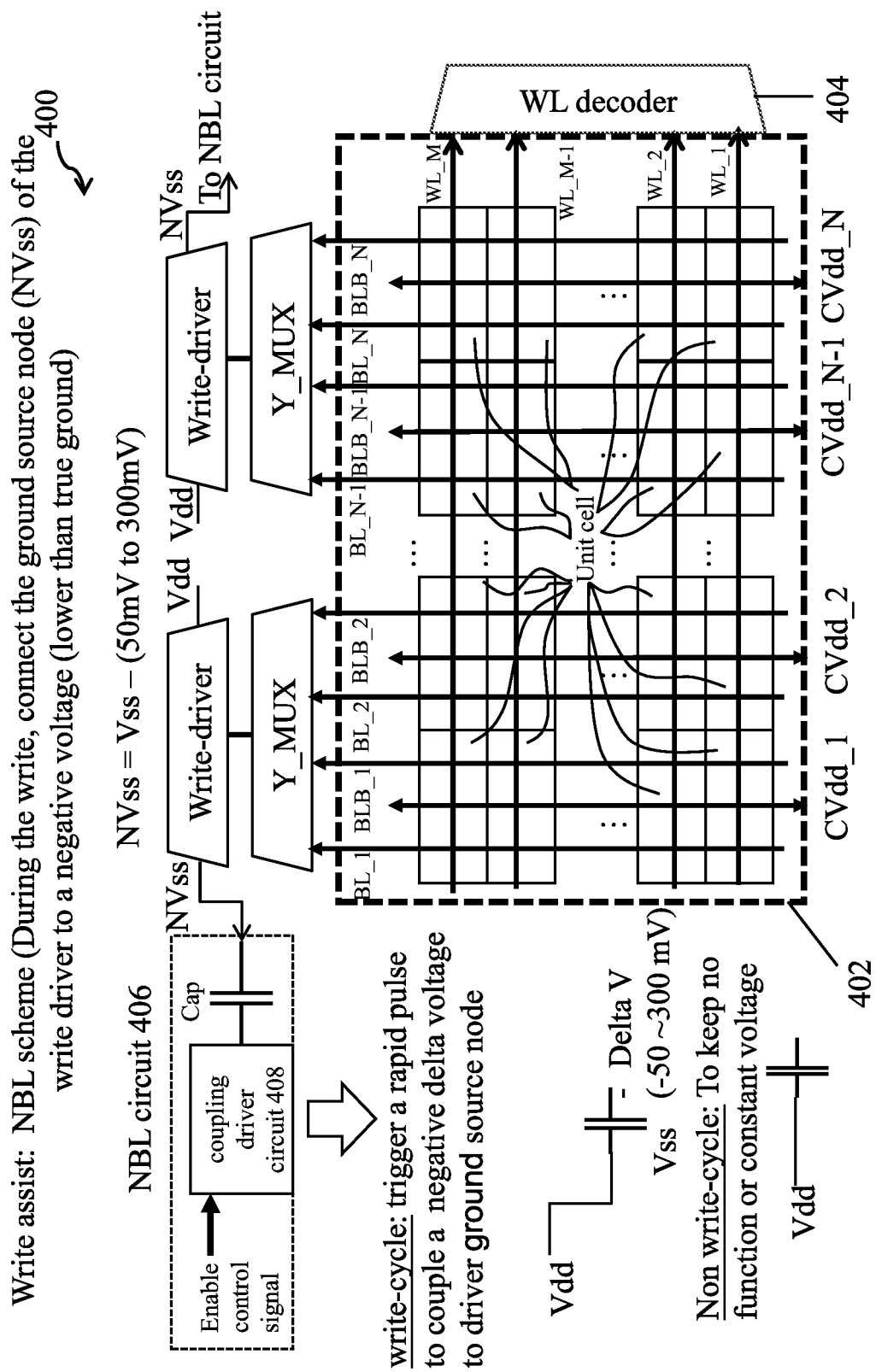
FIG. 4 is a block diagram of a memory circuit in accordance with one or more embodiments.

In some embodiments, word line conductor WL is located on a first metal layer. In some embodiments, voltage reference CVDD, bit line BL, bit line bar BLB, first ground reference node first CVSS and second ground reference node second CVSS are located on a second metal layer. In some embodiments, voltage reference CVDD, bit line BL, bit line bar BLB, first ground reference node first CVSS and second ground reference node second CVSS share a common metal layer. In some embodiments, the layout diagram 300' includes a third metal layer. In some embodiments, the third metal layer is located above the second metal layer. In some embodiments, the layout 300' comprises another word line (not shown), wherein the another word line is electrically connected to the word line. In some embodiments, the bit-line bar, the voltage reference CVdd, the first ground reference node first CVss, second ground reference node the second CVss line, and the bit-line bar are each located on the first metal layer, FIG. 4 is a block diagram of a memory circuit 400 in accordance with one or more embodiments. Memory circuit 400 is an embodiment of the memory cell 100 (shown in FIG. 1A) with similar elements. As shown in FIG. 4, similar elements have a same reference number as shown in FIGS. 1A-1B. Each of the unit cells shown in the memory cell array 402 of FIG. 4 are an embodiment of the memory cells shown in FIGS. 1A-1B, 2A and 3A.

Memory circuit 400 comprises a memory cell array 402, a word line decoder 404, a multiplexer Y_MUX, a write driver Write-driver and an NBL circuit 406.

Memory cell array 402 comprises an array of memory cells including M rows by N columns, where M is an integer corresponding to the number of rows and N is an integer corresponding to the number of columns. In some embodiments, M is an integer ranging from 1 to 512. In some embodiments, N is an integer ranging from 1 to 512. A macro is a portion of a memory cell array. In some embodiments, memory cell array 402 is divided into one or more macros.

During a write operation, the NBL circuit 406 is configured to selectively adjust the voltage of the ground reference VSS. The NBL circuit 406 is a write-assist circuitry. The NBL circuit 406 comprises a negative voltage generator (e.g. coupling driver circuit 408) which is electrically connected to the bit-line and the bit-line bar of each cell of the plurality of SRAM cells in memory cell array 402.

NBL circuit 406 is configured to receive an input signal (e.g., enable control signal) which triggers the negative voltage generator (e.g. coupling driver circuit 408) to selectively adjust the write driver ground reference voltage VSS. In some embodiments, during a write cycle of the embedded SRAM chip (e.g., memory cell array 402), the bit-line (or the bit line bar) is discharged to a low voltage (Vss) state, and the bit line bar (or the bit line) is pre-charged to a high voltage (Vdd) state, and the negative voltage generator is configured to reduce the bit line voltage lower than the low voltage state (e.g., VSS), if the negative voltage generator is enabled by the control signal). The ground source node NVSS is coupled to either the bit-line or the bit-line bar through the multiplexers Y-MUX.

In some embodiments, during a write operation of a selected memory cell, the NBL circuit 406 is configured to connect the ground source node (NVSS) of the write driver Write-driver to a negative voltage. In some embodiments, the negative voltage NVss is lower than a ground reference (VSS). In some embodiments, the negative voltage NVss is lower than the ground reference (VSS) by a first range. In some embodiments, the first range ranges from 50 millivolts (mV) to 300 mV.

In some embodiments, the ground source node (NVSS) of the write driver Write-driver is electrically connected to a reset or zeroing circuit (not shown), which is configured to selectively reset the voltage of the ground source node (NVSS). In some embodiments, the reset or zeroing circuit comprises an NMOS transistor, where the source is connected to ground, and the gate is connected to a reset signal, which switches the NMOS transistor on and off.

NBL circuit 406 is electrically connected to the ground source node NVSS of the write driver circuit Write-driver. NBL circuit 406 is configured to generate a negative voltage level NVss, that is substantially equal to the difference between the ground reference VSS and 50 to 300 mV.

In some embodiments, memory circuit 400 comprises periphery circuit. Periphery circuit comprises a write driver Write-driver, a sense amplifier (not shown) and a write assist circuit (e.g., NBL circuit 406).

Figures 5A, 5B:
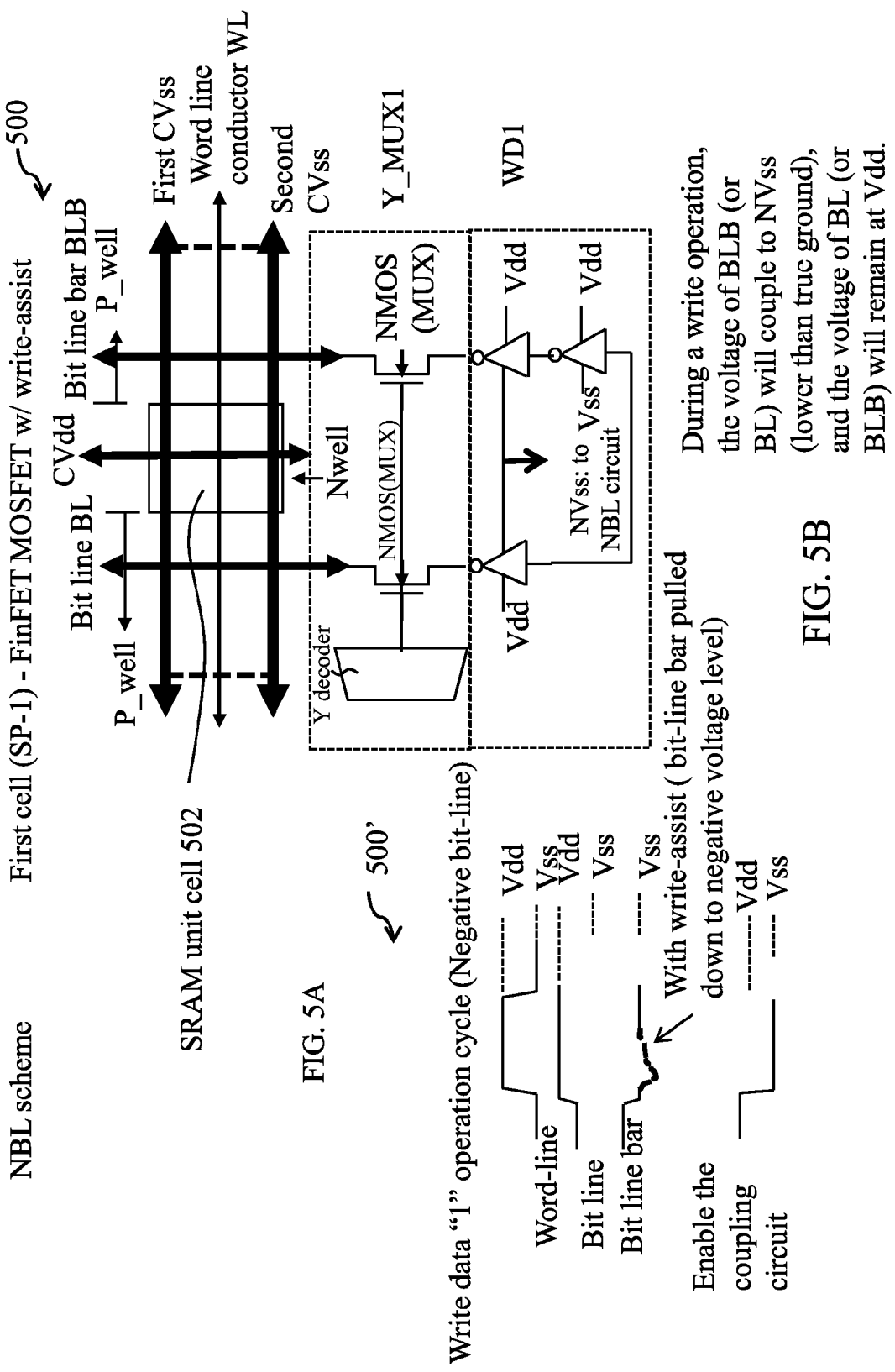
FIG. 5A is a block diagram of the memory circuit in FIG. 4 in accordance with one or more embodiments.
FIG. 5B is a waveform diagram of signals applied to the memory circuit in FIG. 5A in accordance with one or more embodiments.

FIG. 5A is a block diagram of a memory circuit 500 in accordance with one or more embodiments. Memory circuit 500 is an embodiment of the memory circuit 400 (shown in FIG. 4) with similar elements. As shown in FIG. 5, similar elements have a same reference number as shown in FIG. 4. Unit cell 502 is an embodiment of the memory cells shown in FIGS. 1A-1B, 2A and 3A. Memory circuit 500 is a portion of the memory circuit 400 shown in FIG. 4.

Memory circuit 500 comprises a unit cell 502, a Y decoder, a multiplexer Y_MUX1, a write driver WD1, bit line BL, bit line bar BLB, first ground reference node First CVSS, second ground reference node Second CVSS, and a voltage reference CVDD.

FIG. 5B is a waveform diagram of signals 500' applied to the memory circuit 500 in FIG. 5A in accordance with one or more embodiments. In some embodiments, during a write operation, after the coupling circuit 408 is disabled, the voltage of the bit line bar BLB is coupled to lower than true ground (e.g., NVSS), and the voltage of the bit line BL remains at a logically high level Vdd. In some embodiments, during a write operation, after the coupling circuit 408 is disabled, the voltage of the bit line BL is coupled to lower than true ground (e.g., NVSS), and the voltage of the bit line bar BLB remains at a logically high level Vdd. Although FIG. 5B illustrates the bit line BL is pre-charged to high and the bit line bar BLB is discharged towards VSS, in some embodiments, the bit line bar BLB is pre-charged to high and the bit line BL is discharged towards VSS.

Figures 6A, 6B:
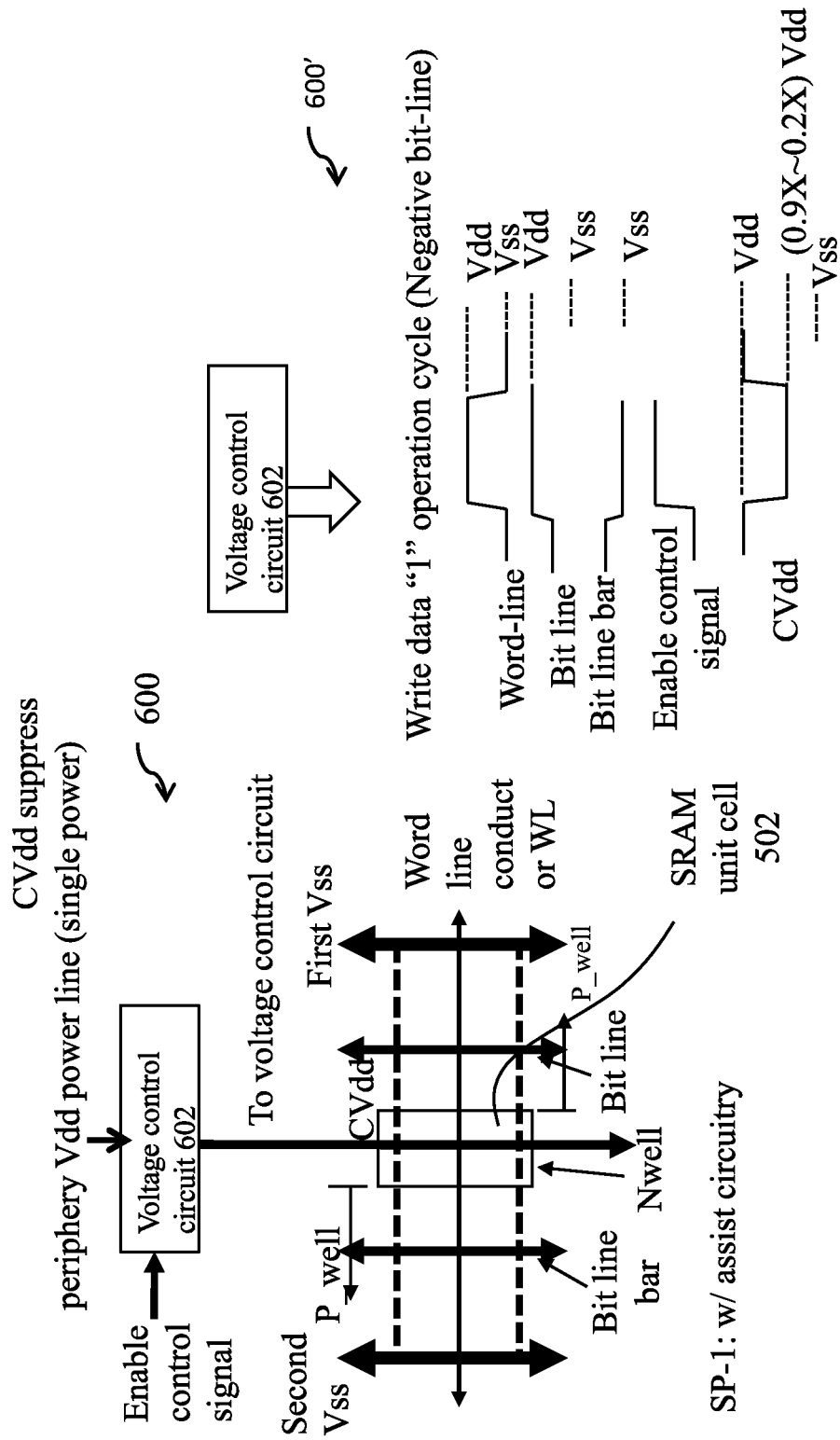
FIG. 6A is a block diagram of a memory circuit in accordance with one or more embodiments.
FIG. 6B is a waveform diagram of signals applied to the memory circuit in FIG. 6A in accordance with one or more embodiments.

FIG. 6A is a block diagram of a memory circuit 600 in accordance with one or more embodiments. Memory circuit 600 is an embodiment of the memory circuit 400 (shown in FIG. 4) with similar elements. As shown in FIG. 6, similar elements have a same reference number as shown in FIG. 4. Unit cell 502 is an embodiment of the memory cells shown in FIGS. 1A-1B, 2A and 3A. In comparison with the memory circuit 500 of FIG. 5, memory circuit 600 is a portion of the memory circuit 500 shown in FIG. 5 without Y decoder, multiplexer Y_MUX1 and write driver WD1.

Memory circuit 600 comprises a unit cell 502, a voltage control circuit 602, bit line BL, bit line bar BLB, first ground reference node First CVSS, second ground reference node Second CVSS, and a voltage reference CVDD.

Voltage control circuit 602 is configured to receive an input signal (e.g., enable control signal) which triggers voltage control circuit 602 to selectively adjust the reference voltage CVDD provided to the unit cell 502. Voltage control circuit 602 is a column-based voltage control circuit and is connected to the CVdd line of the unit cell 502.

During a write operation, the voltage control circuit 602 is configured to selectively adjust the voltage reference signal CVDD. The voltage control circuit 602 is a write-assist circuitry. During a write operation of a selected memory cell in the embedded SRAM chip (e.g., memory cell array 402), the voltage control circuit 602 is configured to reduce a voltage of the CVdd line of the selected cell by a predetermined voltage, wherein the predetermined voltage ranges from 50 mV to 600 mV. During a read operation, a voltage output node of the voltage control circuit 602 is configured to provide a substantially equal voltage as the voltage received on an input voltage node of the voltage control unit 602. During a read operation, a voltage output node of the voltage control circuit 602 is configured to provide a voltage greater than the voltage received on an input voltage node of the voltage control unit 602.

In some embodiments, memory circuit 600 comprises periphery circuit. Periphery circuit comprises a write driver (not shown), a sense amplifier (not shown) and a write assist circuit (voltage control circuit 602).

FIG. 6B is a waveform diagram of signals 600' applied to memory circuit 600 in FIG. 6A in accordance with one or more embodiments. In some embodiments, during a write operation, after the voltage control circuit 602 is enabled, the voltage of the bit line bar BLB is discharged to ground (e.g., VSS), the voltage of the bit line BL remains at a logically high level Vdd, and the reference voltage CVDD is suppressed. In some embodiments, the reference voltage CVDD is suppressed to a suppressed voltage level. In some embodiments, the suppressed voltage level ranges from 0.2*VDD to 0.9*VDD. Although FIG. 6B illustrates the bit line BL is pre-charged to high and the bit line bar BLB is discharged to VSS, in some embodiments, the bit line bar BLB is pre-charged to high and the bit line BL is discharged to VSS.

Figure 7A:
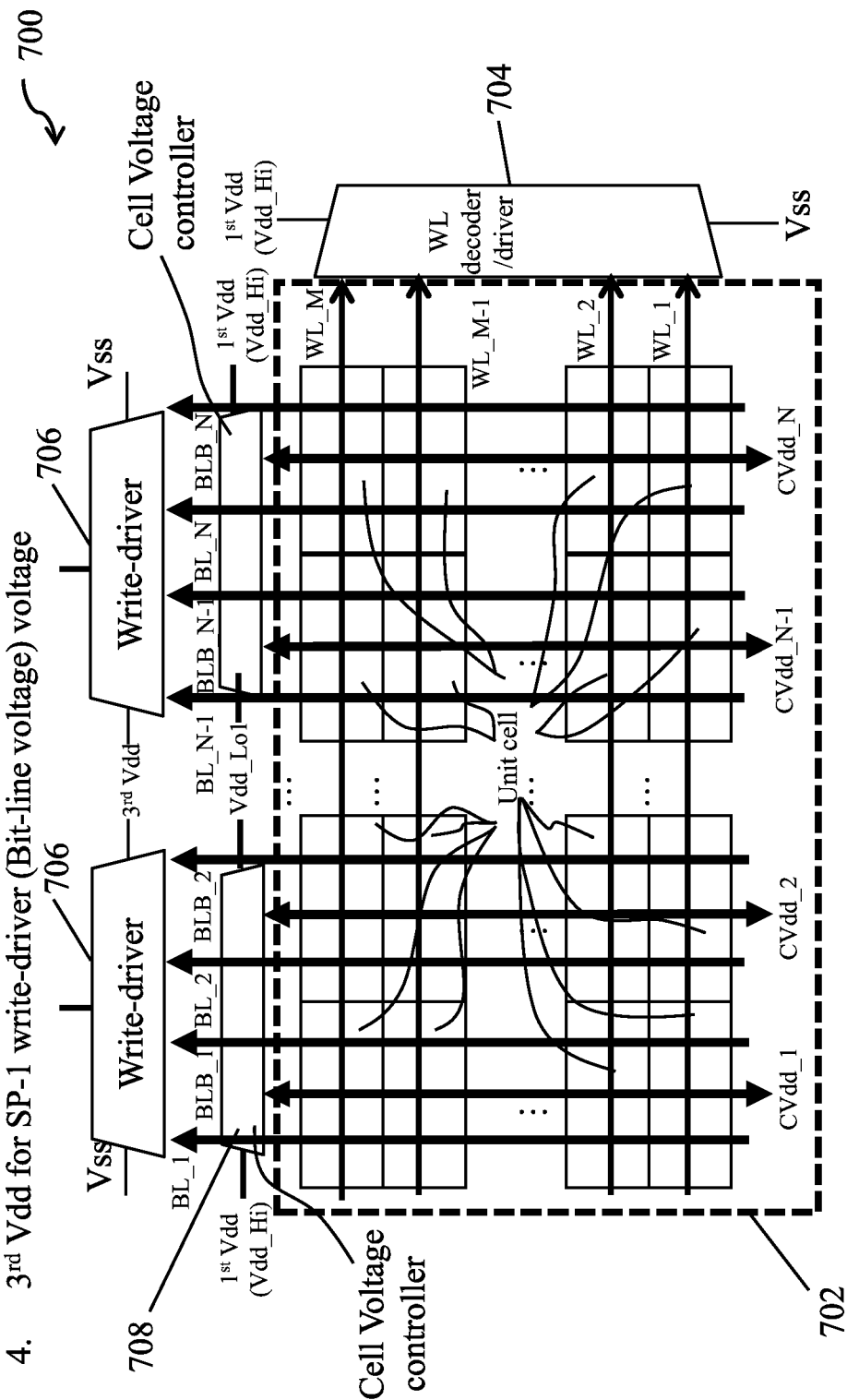
FIG. 7A is a block diagram of a memory circuit in accordance with one or more embodiments.

FIG. 7A is a block diagram of a memory circuit 700 in accordance with one or more embodiments. Memory circuit 700 is an embodiment of the memory cell 100 (shown in FIG. 1A) with similar elements. As shown in FIG. 7A, similar elements have a same reference number as shown in FIGS. 1A-1B. In some embodiments, each of the unit cells shown in the memory cell array 702 of FIG. 7A are an embodiment of the memory cells shown in FIGS. 1A-1B, 2A and 3A. In some embodiments, each of the unit cells shown in memory cell array 702 of FIG. 7A are an embodiment of the memory cells shown in FIGS. 1A-1B, 2B and 3B.

Memory circuit 700 comprises a memory cell array 702, a word line driver circuit 704, a write driver circuit 706 (e.g., bit line and bit line bar) and a cell voltage controller 708.

Memory circuit 700 is configured to utilize a dual-rail power supply (e.g. power supply $1^{st}$ VDD and power supply 3rd VDD). In some embodiments, a write assist circuit is not utilized with memory circuit 700.

Memory cell array 702 comprises an array of memory cells (e.g., unit cell) including M rows by N columns, where M is an integer corresponding to the number of rows and N is an integer corresponding to the number of columns. In some embodiments, M is an integer ranging from 1 to 512. In some embodiments, N is an integer ranging from 1 to 512. In some embodiments, memory cell array 702 is divided into one or more macros. In some embodiments, each of the unit cells in memory cell array 702 is a single fin cell (as shown in FIG. 2A).

The word line (e.g., WL_1 to WL_M) of each cell of the memory cell array 702 is electrically connected to a word line driver circuit 704. The word line driver circuit 704 is electrically connected to a power supply $1^{st}$ VDD.

The bit line of each cell of the memory cell array 702 is electrically connected to a write driver circuit 706. The write driver circuit 706 is electrically connected to a power supply 1st VDD.

The cell voltage controller 708 comprises a low voltage terminal VDD_Lo1 and a high voltage terminal VDD_Hi. In some embodiments, the low voltage terminal VDD_Lo1 is electrically connected to a reference voltage VSS. In some embodiments, the low voltage terminal VDD_Lo1 is electrically connected to a voltage level greater than reference voltage VSS, but less than the power supply 1st VDD. The high voltage terminal VDD_Hi is electrically connected to a power supply 1st VDD. During a standby mode of the memory circuit 700, the cell voltage controller 708 is configured to be electrically connected to the low voltage terminal VDD_Lo1. During an active mode (read/write cycle) of the memory circuit 700, the cell voltage controller 708 is configured to be electrically connected to the high voltage terminal VDD_Hi.

Figure 7B:
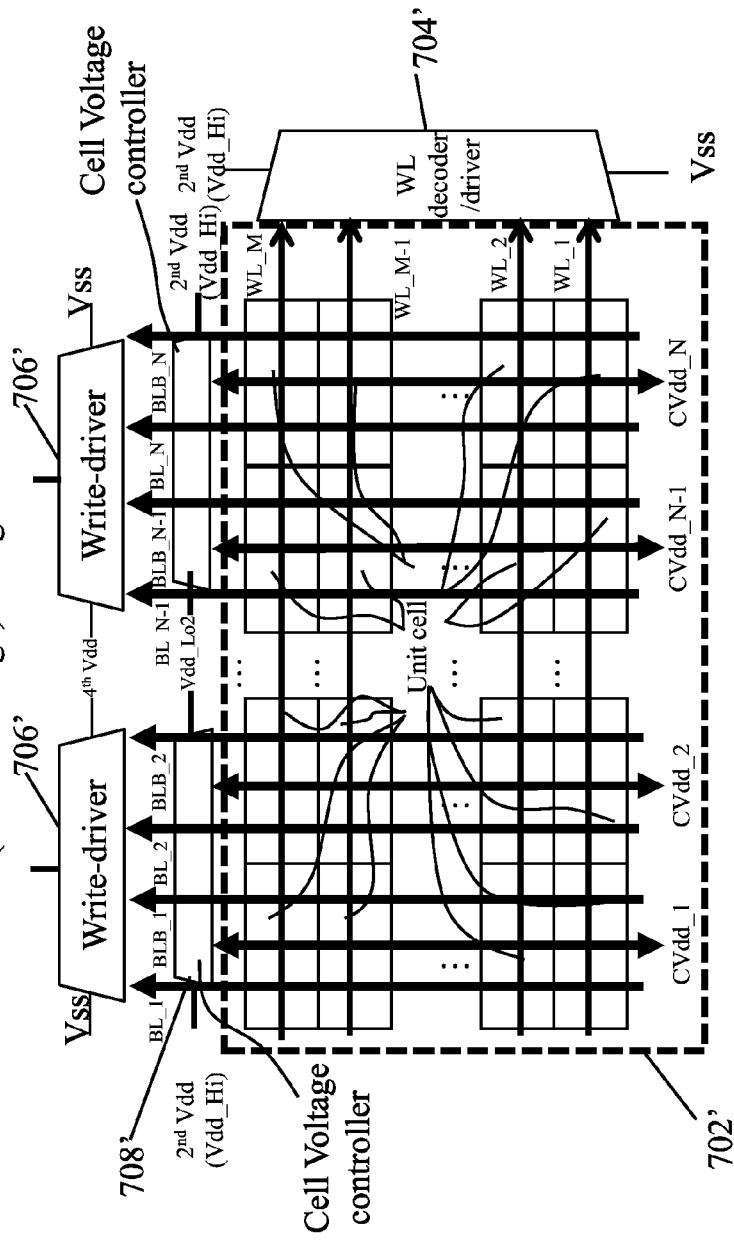
FIG. 7B is a block diagram of a memory circuit in accordance with one or more embodiments.

FIG. 7B is a block diagram of a memory circuit 700' in accordance with one or more embodiments. Memory circuit 700' is an embodiment of the memory cell 100 (shown in FIG. 1A) with similar elements. As shown in FIG. 7B, similar elements have a same reference number as shown in FIGS. 1A-1B. In some embodiments, each of the unit cells shown in memory cell array 702' of FIG. 7B are an embodiment of the memory cells shown in FIGS. 1A-1B, 2B and 3B. In some embodiments, each of the unit cells shown in the memory cell array 702 of FIG. 7A are an embodiment of the memory cells shown in FIGS. 1A-1B, 2A and 3A.

Memory circuit 700' comprises a memory cell array 702', a word line driver circuit 704', a write driver circuit 706' (e.g., bit line and bit line bar) and a cell voltage controller 708'.

Memory circuit 700' is configured to utilize a dual-rail power supply (e.g. power supply 2nd VDD and power supply 4th VDD). In some embodiments, a write assist circuit is not utilized with memory circuit 700'.

Memory cell array 702' comprises an array of memory cells including M rows by N columns, where M is an integer corresponding to the number of rows and N is an integer corresponding to the number of columns. In some embodiments, M is an integer ranging from 1 to 512. In some embodiments, N is an integer ranging from 1 to 512. In some embodiments, memory cell array 702' is divided into one or more macros. In some embodiments, each of the unit cells (in memory cell array 702') includes single fin transistor devices (e.g., transistor devices PU-1 and PU-2), and multiple-fin transistor devices (e.g., transistor devices PD-1, PD-2, PG-1 and PG-2) as shown in FIG. 2B.

The word line (e.g., WL_1 to WL_M) of each cell of the memory cell array 702' is electrically connected to a word line driver circuit 704'. The first word line driver circuit 704' is electrically connected to a power supply 2nd VDD.

The bit line of each cell of the memory cell array 702' is electrically connected to a write driver circuit 706'. The write driver circuit 706' is electrically connected to a power supply 4th VDD.

The cell voltage controller 708' comprises a low voltage terminal VDD_Lo2 and a high voltage terminal VDD_Hi. In some embodiments, the low voltage terminal VDD_Lo2 is electrically connected to a reference voltage VSS. In some embodiments, the low voltage terminal VDD_Lo2 is electrically connected to a voltage level greater than reference voltage VSS, but less than the power supply $2^{nd}$ VDD. The high voltage terminal VDD_Hi is electrically connected to a power supply $2^{nd}$ VDD. During a standby mode of the memory circuit 700', the cell voltage controller 708 is configured to be electrically connected to the low voltage terminal VDD_Lo2. During an active mode (read/write cycle) of the memory circuit 700', the cell voltage controller 708' is configured to be electrically connected to the high voltage terminal VDD_Hi.

In some embodiments, the voltage provided by the power supply 1st VDD is greater than the voltage provided by the power supply $2^{nd}$ VDD by at least 40 mV, which improves the read margin and write margin of the memory cells in memory cell array. In some embodiments, the voltage provided by the power supply $2^{nd}$ VDD is substantially equal to the voltage provided by power supply $3^{rd}$ VDD and the voltage provided by power supply 4th VDD. In some embodiments, memory circuit 700 and memory circuit 700' are part of single SRAM memory chip. In some embodiments, memory circuit 700 is a first macro and memory circuit 700' is a second macro, where the first macro and the second macro are both part of single SRAM memory chip.

Figure 8A:
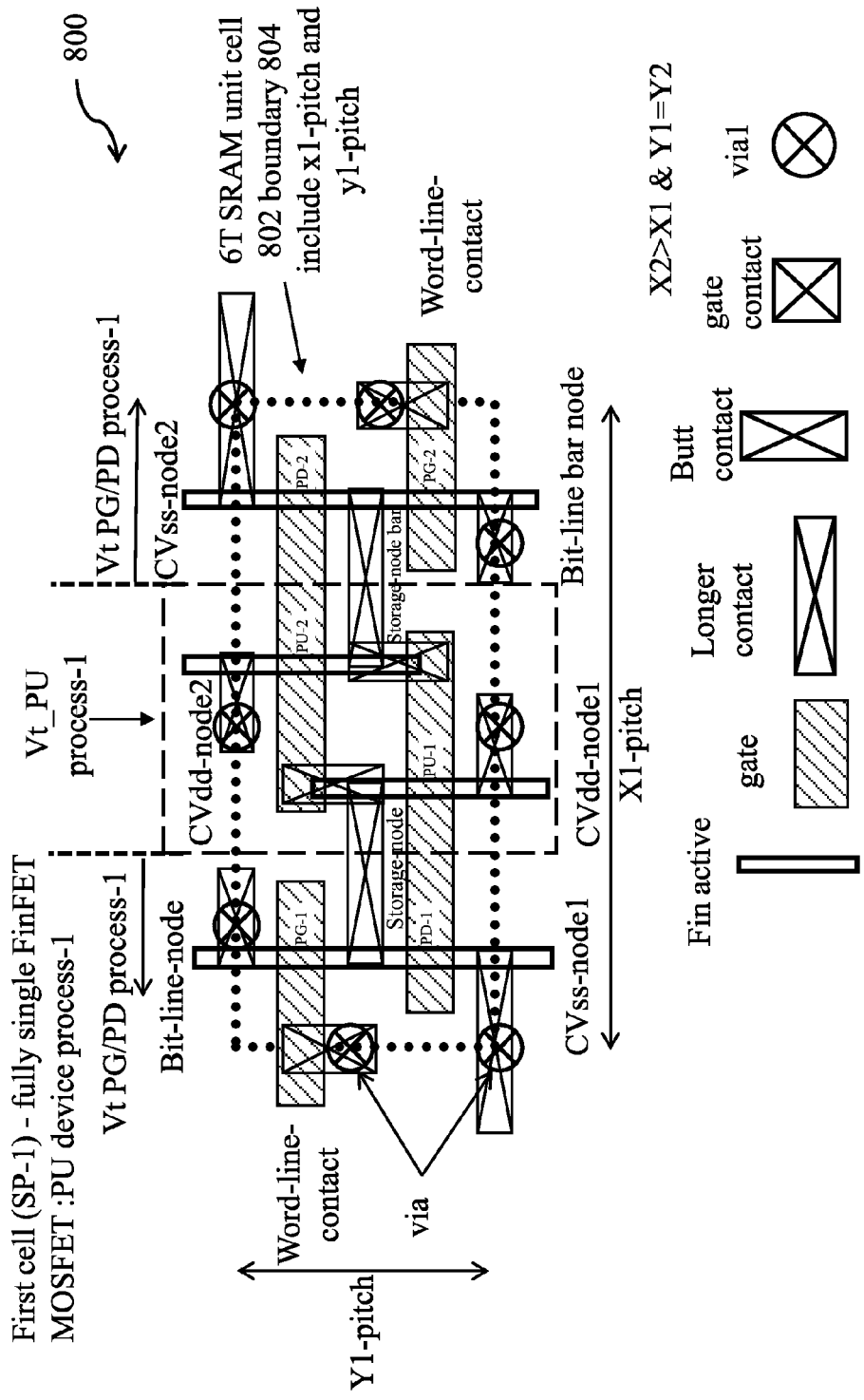
FIG. 8A is a portion of a layout diagram of the memory cell in FIG. 7A in accordance with one or more embodiments.

FIG. 8A is a portion of a layout diagram 800 of the memory cell in FIG. 7A in accordance with one or more embodiments. The components of the layout diagram 800 shown in FIG. 8A are the same or are similar to those depicted in FIGS. 1A-1B with the same reference number, and the detailed description thereof is omitted. While layout diagram 800 illustrates vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

Layout diagram 800 is an embodiment of a single-fin memory cell. Layout diagram 200 is an embodiment of layout diagram 200 shown in FIG. 2A with similar elements. A cell boundary 804 defines a unit cell 802. Unit cell 802 is an embodiment of unit cell 202 shown in FIG. 2A with similar elements. In some embodiments, a threshold voltage of the PU transistors (e.g., PU-1 and PU-2) of layout 800 shown in FIG. 8A is greater than a threshold voltage of the PU transistors (e.g., PU-1 and PU-2) of layout 800' shown in FIG. 8B by at least 20 mV. In some embodiments, an additional N-type doping step is performed to increase the threshold voltage (e.g., Vcc_min) of the PU transistors (e.g., PU-1 and PU-2) of layout 800 shown in FIG. 8A.

The PD transistors (e.g., PD-1 and PD-2) of layout 800 shown in FIG. 8A comprises a first channel width (fin width-1). The PD transistors (e.g., PD-1 and PD-2) of layout 800' shown in FIG. 8B comprises a second channel width (fin width-2). In some embodiments, the first channel width (fin width-1) is wider than the second channel width (fin width-2) by at least 10%.

Figure 8B:
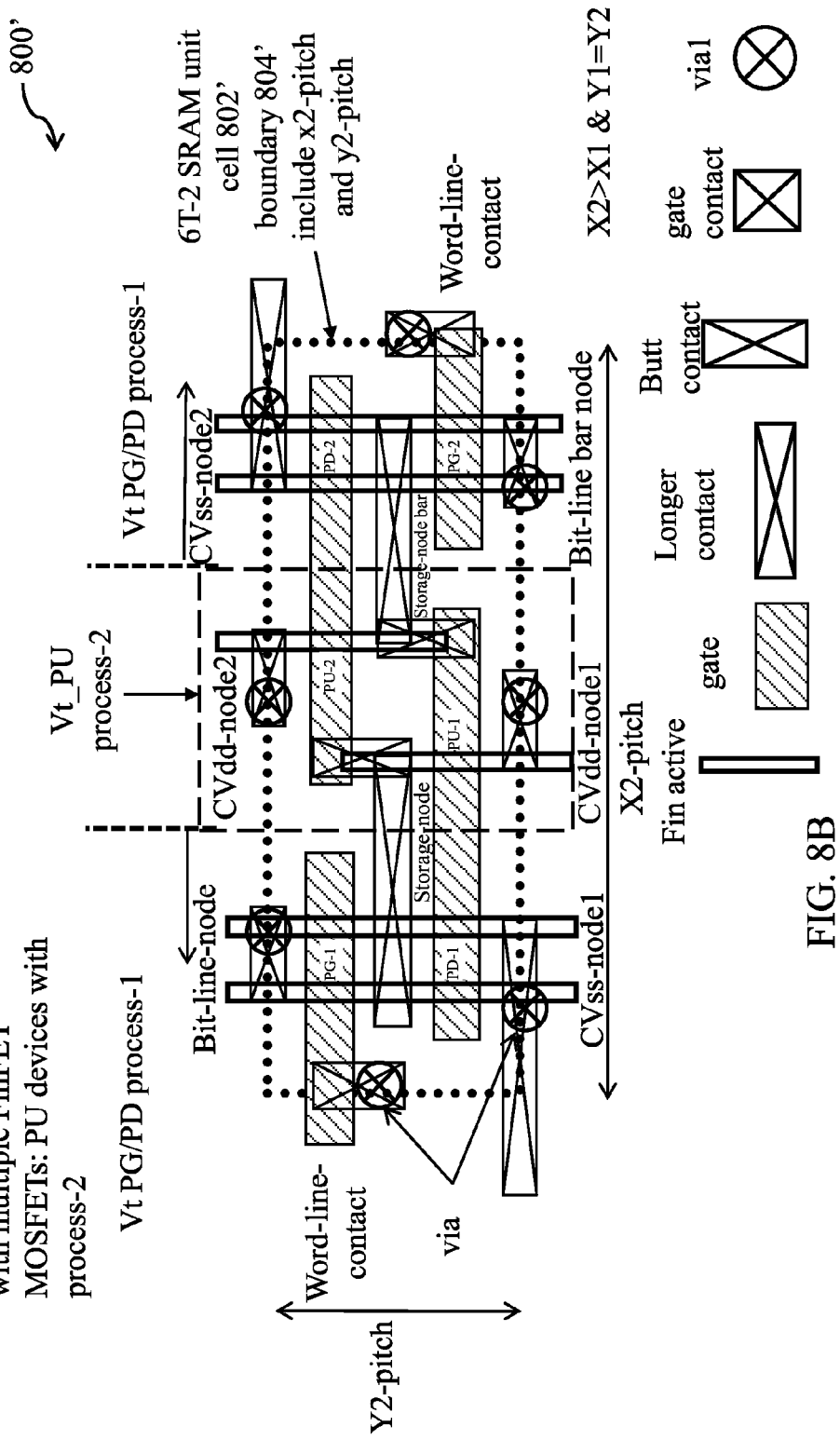
FIG. 8B is a portion of a layout diagram of the memory cell in FIG. 7B in accordance with one or more embodiments.

FIG. 8B is a portion of a layout diagram 800' of the memory cell in FIG. 7B in accordance with one or more embodiments. The components of the layout diagram 800' shown in FIG. 8B are the same or are similar to those depicted in FIGS. 1A-1B with the same reference number, and the detailed description thereof is omitted. While layout diagram 800' illustrates vias (e.g., via1), the first metal layer is not shown for ease of viewing. The metal layer M0 (not shown) includes the gate contact, the butt contact and the longer contact. In some embodiments, the gate contact, the butt contact and the longer contact are referred to as local interconnects (LI).

Layout diagram 800' is an embodiment of a hybrid multiple-fin/single fin memory cell. For example, as shown in FIG. 8B, transistor devices PU-1 and PU-2 are single fin transistor devices, and transistor devices PD-1, PD-2, PG-1 and PG-2 are multiple-fin transistor devices. Layout diagram 800' is an embodiment of layout diagram 200' shown in FIG. 2B with similar elements. A cell boundary 804' defines a unit cell 802'. Unit cell 802' is an embodiment of unit cell 202' shown in FIG. 2B with similar elements.

In some embodiments, the first Y-pitch Y1 is substantially equal to the second Y-pitch Y2. In some embodiments, unit cell 202' includes a multiple-fin/single fin hybrid memory cell configured to not be connected to a write assist circuitry. In some embodiments, the cell pitch ratio of X2 to Y1 (X2/Y1) is substantially equal to 2.8. In some embodiments, a length ratio of X2 to X1 (X2/X1) is substantially equal to 1.235.

Figure 9A:
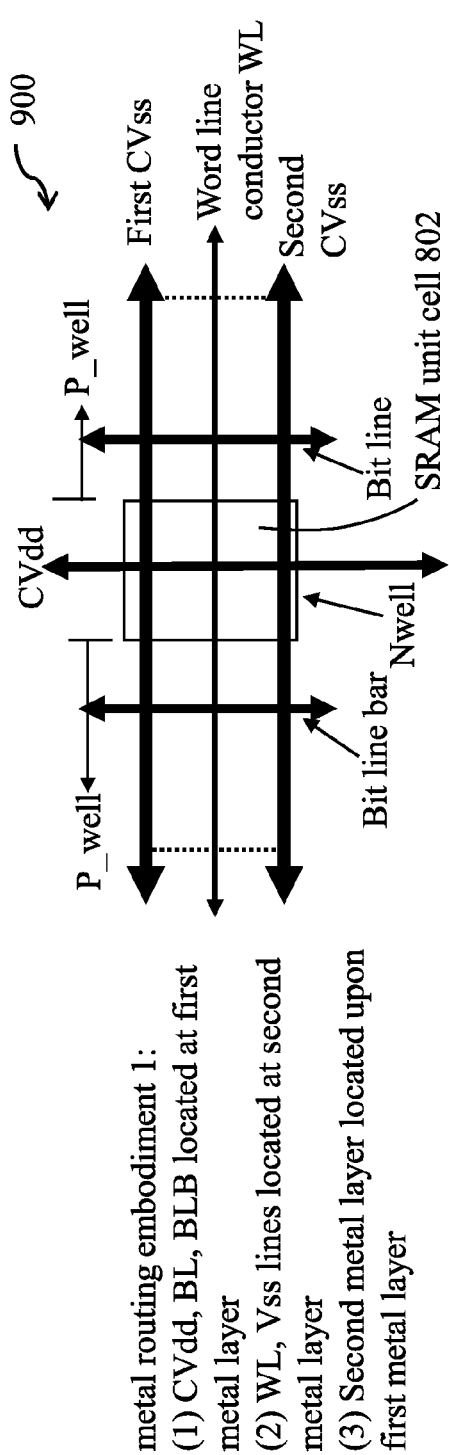
FIG. 9A is a portion of a layout diagram of the memory cell in FIG. 8A in accordance with one or more embodiments.

FIG. 9A is a portion of a layout diagram 900 of the memory cell in FIG. 8A in accordance with one or more embodiments. Layout diagram 900 is an embodiment of layout diagram 800 (shown in FIG. 8A) with similar elements. As shown in FIG. 9A, similar elements have a same reference number as shown in FIG. 8A.

Layout diagram 900 includes unit cell 802 and conductive lines (e.g., voltage reference CVDD, bit line BL, bit line bar BLB, word line conductor WL, first ground reference node first CVSS and second ground reference node second CVSS).

In some embodiments, voltage reference CVDD, bit line BL and bit line bar BLB are located on a first metal layer. In some embodiments, voltage reference CVDD, bit line BL and bit line bar BLB are located on a common metal layer. In some embodiments, word line conductor WL, first ground reference node first CVSS and second ground reference node second CVSS are located on a second metal layer. In some embodiments, word line conductor WL, first ground reference node first CVSS and second ground reference node second CVSS are located on a common metal layer. In some embodiments, the second metal layer is located above the first metal layer. In some embodiments, the layout diagram 900 includes a third metal layer. In some embodiments, the third metal layer is located above the second metal layer.

Figure 9B:
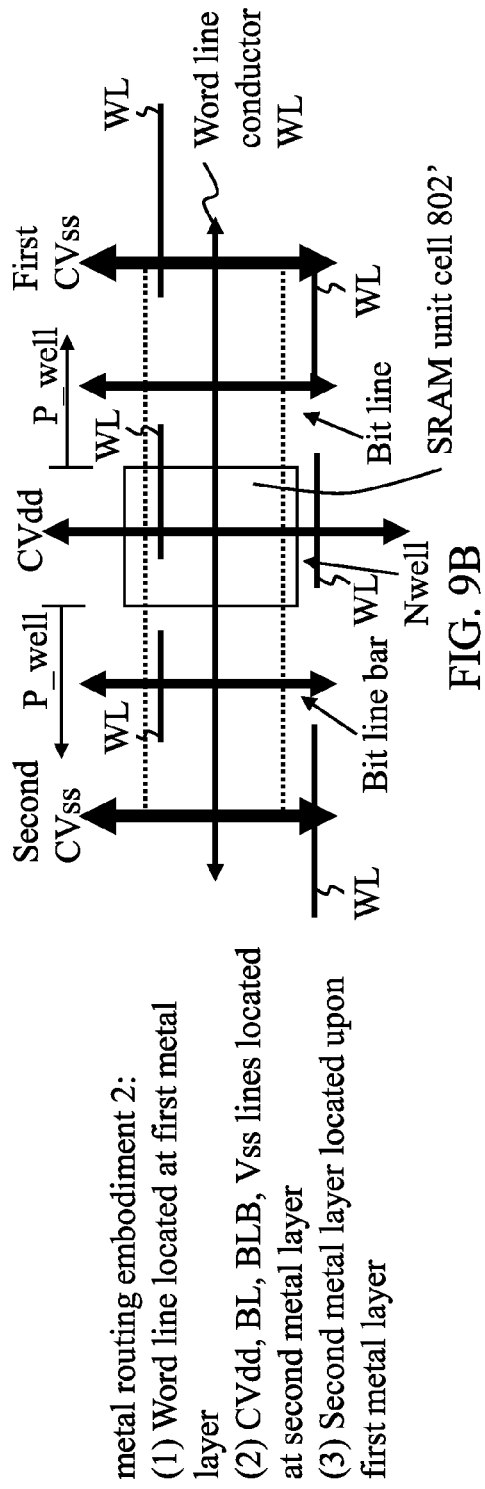
FIG. 9B is a portion of a layout diagram of the memory cell in FIG. 8B in accordance with one or more embodiments.

FIG. 9B is a portion of a layout diagram 900' of the memory cell in FIG. 8B in accordance with one or more embodiments. Layout diagram 900' is an embodiment of layout diagram 800' (shown in FIG. 8B) with similar elements. As shown in FIG. 9B, similar elements have a same reference number as shown in FIG. 8B.

Layout diagram 900' includes unit cell 802' and conductive lines (e.g., voltage reference CVDD, bit line BL, bit line bar BLB, word line conductor WL, first ground reference node first CVSS and second ground reference node second CVSS).

In some embodiments, word line conductor WL is located on a first metal layer. In some embodiments, voltage reference CVDD, bit line BL, bit line bar BLB, first ground reference node first CVSS and second ground reference node second CVSS are located on a second metal layer. In some embodiments, voltage reference CVDD, bit line BL, bit line bar BLB, first ground reference node first CVSS and second ground reference node second CVSS share a same metal layer. In some embodiments, the layout diagram 900' includes a third metal layer (not shown). In some embodiments, the third metal layer is located above the second metal layer. In some embodiments, the layout 900' comprises another word line (not shown), wherein the another word line is electrically connected to the word line WL.

In some embodiments, layout diagram 900' further comprises a ground reference node third CVSS (not shown) located against cell boundary 804', and shared with an adjacent cell (not shown). A cell boundary is the region between two adjacent memory cells.

Figure 10:
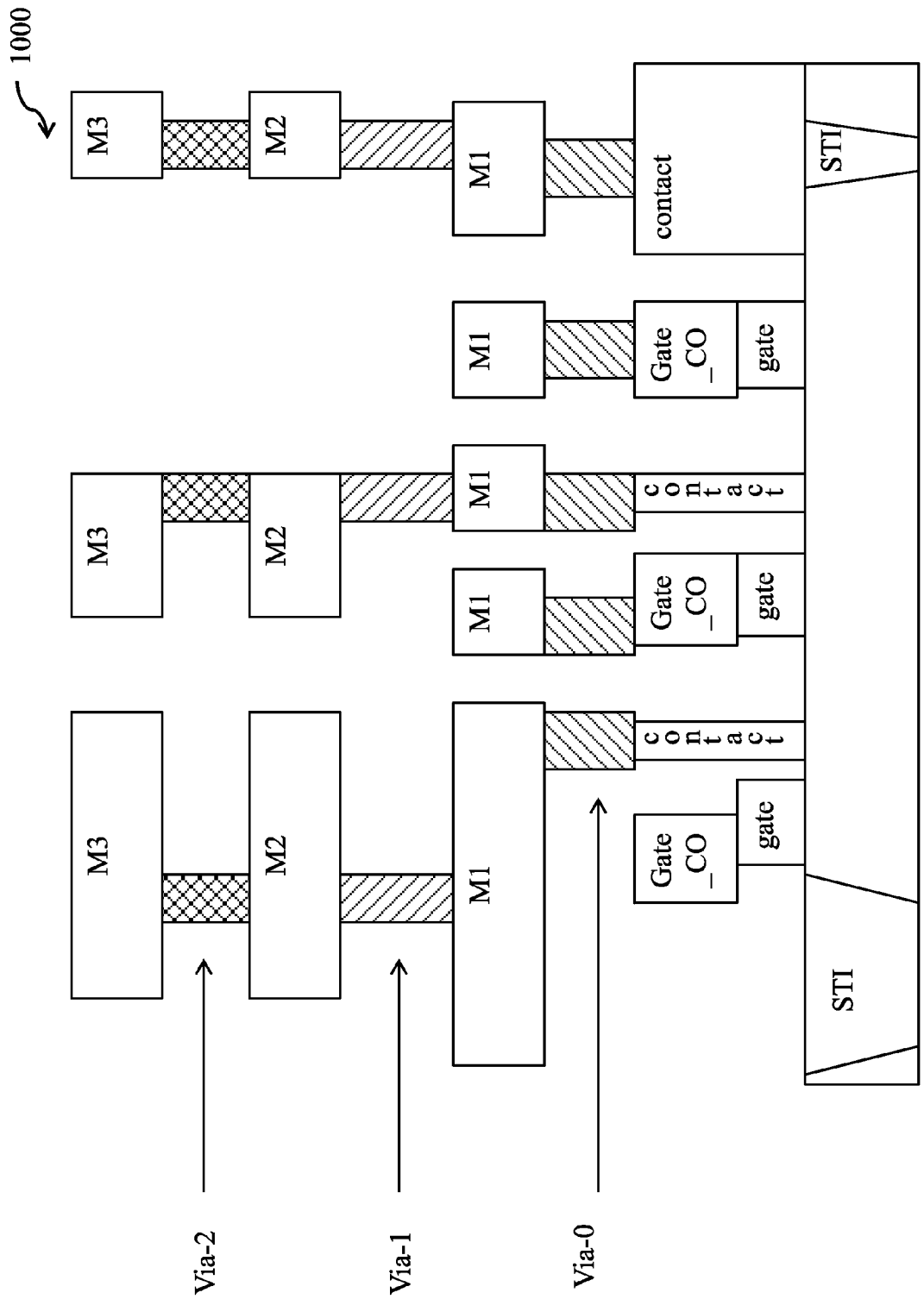
FIG. 10 is a side view of a portion of a memory cell in accordance with one or more embodiments.

FIG. 10 is a side view of a portion of a memory cell 1000 in accordance with one or more embodiments. Memory cell 1000 is an embodiment of the memory cell 100 (shown in FIG. 1A) with similar elements. As shown in FIG. 10, similar elements have a same reference number as shown in FIGS. 1A-1B. In some embodiments, one or more of the memory cells shown in FIGS. 1A-1B, 2A-2B, 3A-3B, 4, 5A, 6A, 7A-7B, 8A-8B and 9A-9B utilize the structure shown in FIG. 10.

Memory cell 1000 comprises a zero via Via-0, first via Via-1, second via Via-2, metal layer M0, metal layer M1, metal layer M2, metal layer M3.

Metal layer M0 is located below metal layer M1. Metal layer M0 electrically connects the gate and drain of the memory cell to other metal layers (e.g., metal layer M1, metal layer M2, metal layer M3). Metal layer M0 comprises one or more local interconnects. The local interconnects comprise contacts and gate contacts Gate_CO of the memory cell.

Zero via Via-0 electrically connects metal layer M0 to metal layer M1.

Metal layer M1 is located below metal layer M2. Metal layer M1 electrically connects metal layer M2 to metal layer M0 by first via Via-1.

Metal layer M2 is located below metal layer M3. Metal layer M2 electrically connects metal layer M3 to metal layer M1 by second via Via-2.

Figure 11A:
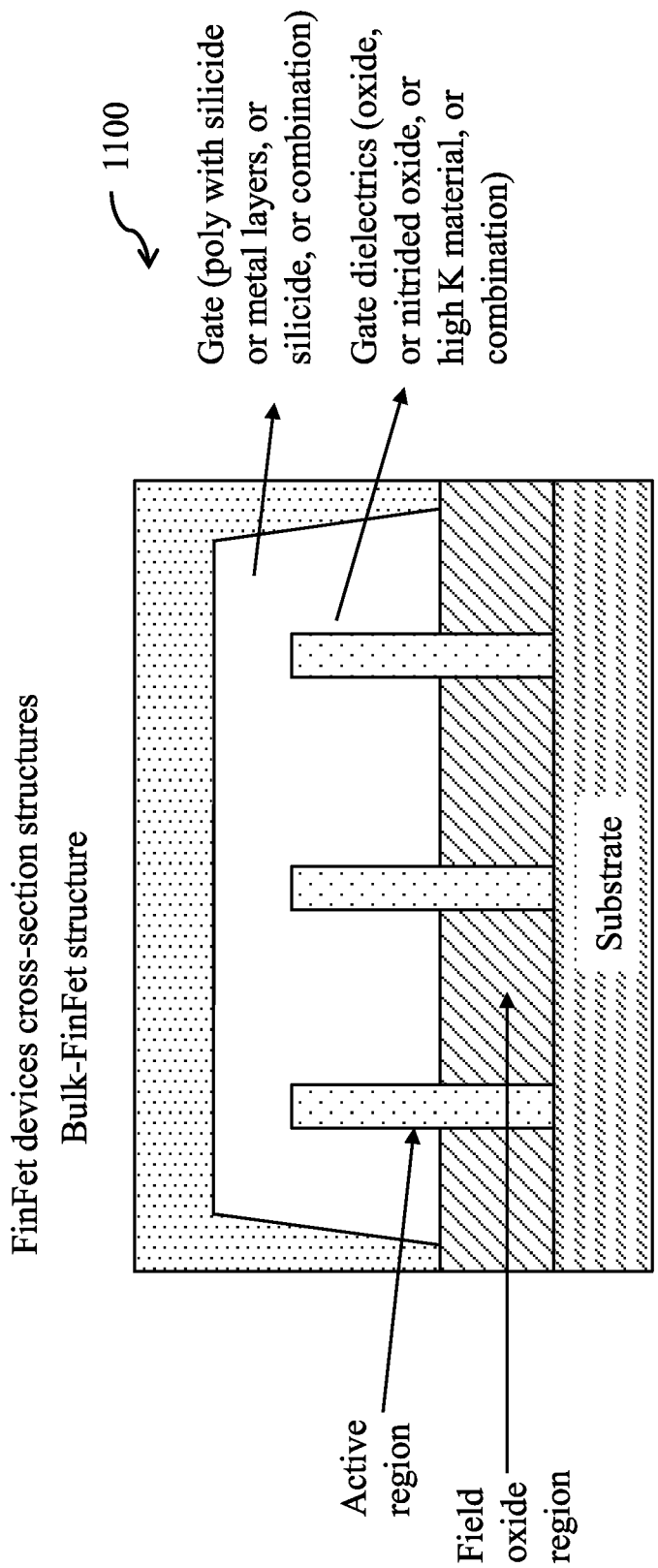
FIG. 11A is a side view of a FinFET transistor in accordance with one or more embodiments.

FIG. 11A is a side view of a FinFET transistor 1100 in accordance with one or more embodiments. FinFET transistor 1100 is a bulk FinFET structure. In some embodiments, one or more of the memory cells shown in FIGS. 1A-1B, 2A-2B, 3A-3B, 4, 5A, 6A, 7A-7B, 8A-8B and 9A-9B utilize FinFET transistor 1100.

Figure 11B:
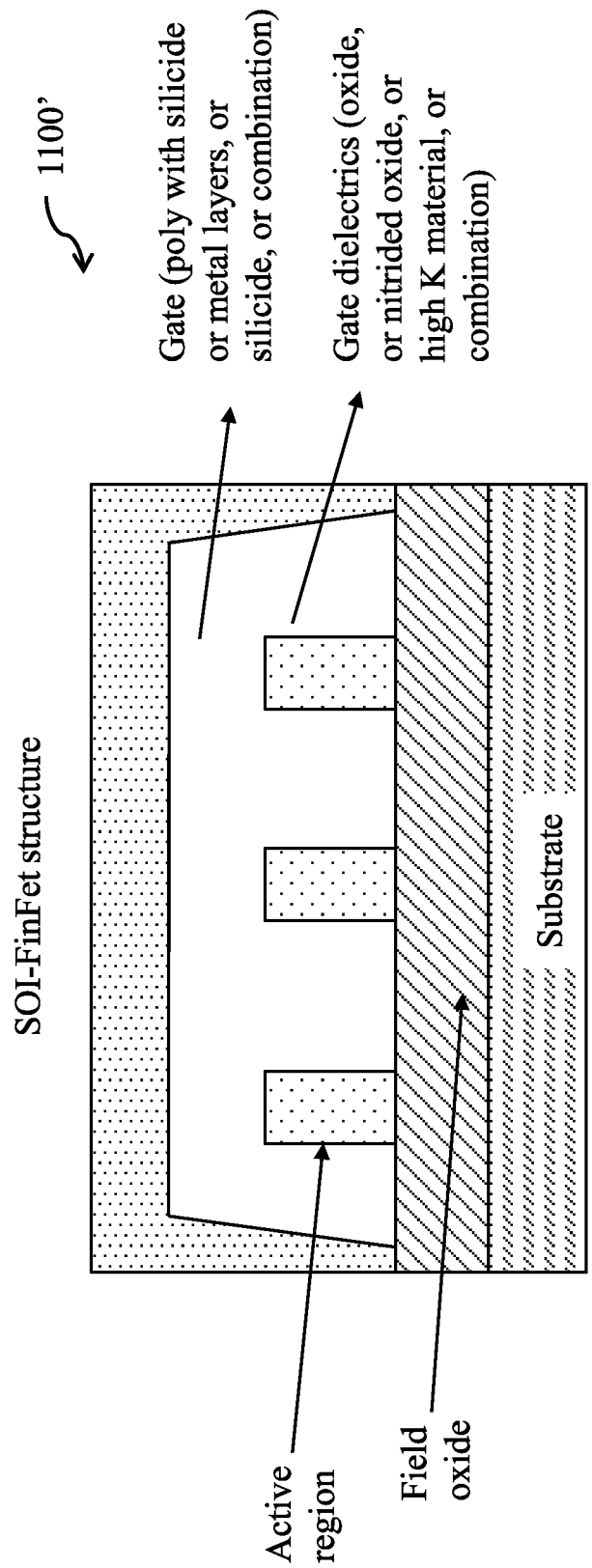
FIG. 11B is a side view of a FinFET transistor in accordance with one or more embodiments.

FIG. 11B is a side view of a FinFET transistor 1100' in accordance with one or more embodiments. FinFET transistor 1100' is an embodiment of the FinFET transistor 1100 (shown in FIG. 11A) with similar elements. As shown in FIG. 11B, similar elements have a same reference number as shown in FIG. 11A.

FinFET transistor 1100' is a silicon on an insulator (SOI) FinFET structure. In some embodiments, one or more of the memory cells shown in FIGS. 1A-1B, 2A-2B, 3A-3B, 4, 5A, 6A, 7A-7B, 8A-8B and 9A-9B utilize FinFET transistor 1100'.

In some embodiments, the present disclosure provides alternative design solutions and process solutions for a fully-single fin FinFET SRAM memory cell. In some embodiments, the present disclosure provides a hybrid single fin FinFET SRAM memory cell/multiple-fin FinFET SRAM memory cell in a single SRAM memory chip which does not require read assist circuitry for all of the memory cells and is more cost effective than alternative configurations. In some embodiments, the present disclosure provides a co-optimized layout of multiple-cell types (e.g., hybrid single fin FinFET SRAM memory cell/multiple-fin FinFET SRAM memory cell in a single SRAM memory chip) utilized in a high volume manufacturing setting.

In some embodiments, the present disclosure describes a fully-single fin FinFET memory cell with a higher alpha ratio (e.g., Ion_PU/Ion_PG is substantially equal to 1). In some embodiments, write-assist circuitry or an extra Vt_PU tuning process are utilized to provide a good write margin for high alpha ratios (e.g., substantially equal to 1).

In some embodiments, the present disclosure describes a multiple-fin FinFET memory cell (e.g., multiple fins for the PG/PD devices and single fins for the PU devices) with a lower alpha ratio (e.g., Ion_PU/Ion_PG<=0.5). In some embodiments, a general operation of the memory cell is utilized for lower alpha ratios (e.g., <=0.5). In some embodiments, a general operation of the memory cell does not require the use of extra write-assist requirements, and standard processes are utilized to manufacture the memory cells which results in lower costs.

One aspect of this description relates to an embedded synchronous random access memory (SRAM) chip, comprising a first single-port (SP) SRAM macro and a second a SP SRAM macro. The first macro comprises a first periphery circuit, and a plurality of first SRAM cells, wherein each cell of the plurality of first SRAM cells comprises a first cross-coupled inverter comprising a data storage node, and a second cross-coupled inverter comprising a data bar storage node; wherein each inverter comprises a P-type single FinFET transistor (PU), an N-type single FinFET transistor (PD), a first pass-gate (PG) transistor, a second PG transistor, wherein each PG transistor is an N-type single FinFET transistor, a CVdd line, a CVss lines, a bit-line; a bit-line bar; a word-line; a shape is a rectangular cell shape, wherein the first shape comprises a first X-pitch(X1), and a first Y-pitch (Y1). The second SP SRAM macro comprises a second periphery circuit, and a plurality of second SRAM cells, wherein each cell of the plurality of second SRAM cells comprises a third cross-coupled inverter comprising a data storage node; and a fourth cross-coupled inverter comprising a data bar storage node; wherein each inverter comprises a P-type single FinFET transistor (PU), and an N-type (PD) transistor, wherein the PD transistor comprises at least two FinFET transistors electrically connected in a parallel configuration; a third PG transistor, and a fourth PG transistor; wherein each of the third PG transistor and the fourth PG transistor comprise at least two FinFET transistors electrically connected in a parallel configuration; a CVdd line; a CVss line; a bit-line; a bit-line bar; a word-line; a shape is a rectangular cell shape, wherein the second shape comprises a second X-pitch (X2), and a second Y-pitch (Y2). Further, each cell of the plurality of first SRAM cells is electrically connected to a write-assist circuitry, wherein the write assist circuitry is configured to assist the write cycle capability of each cell of the plurality of first SRAM cells. Further, each cell of the plurality of second SRAM cells do not include write assist circuitry, and wherein a length ratio of X1 to Y1 is substantially larger than 2, a dimension ratio of Y1 to Y2 are substantially the same, and a length ratio of X2 to X1 is substantially larger than 1.15.

Still another aspect of this description relates to an embedded synchronous random access memory (SRAM) chip, comprising a first single-port (SP) SRAM macro and a second SP SRAM macro. The first macro comprises a first periphery circuit, and a plurality of first SRAM cells, wherein each cell of the plurality of first SRAM cells comprises a first cross-coupled inverter comprising a data storage node, and a second cross-coupled inverter comprising a data bar storage node; wherein each inverter comprises a P-type single FinFET transistor (PU); an N-type single FinFET transistor (PD); a first pass-gate (PG) transistor; a second PG transistor, wherein each PG transistor is an N-type single FinFET transistor; a CVdd line; a CVss lines; a bit-line; a bit-line bar; a word-line; a first shape comprises a first X-pitch (X1), and a first Y-pitch (Y1). The second SP SRAM macro comprises a second periphery circuit, and a plurality of second SRAM cells, wherein each cell of the plurality of second SRAM cells comprises a third cross-coupled inverter comprising a data storage node; and a fourth cross-coupled inverter comprising a data bar storage node; wherein each inverter comprises a P-type single FinFET transistor (PU), and an N-type (PD) transistor, wherein the PD transistor comprises at least two FinFET transistors electrically connected in a parallel configuration; a third PG transistor, and a fourth PG transistor; wherein each of the third PG transistor and the fourth PG transistor comprise at least two FinFET transistors electrically connected in a parallel configuration; a CVdd line; a CVss lines; a bit-line; a bit-line bar; a word-line; a second shape comprises a second X-pitch (X2), and a second Y-pitch (Y2). Further, each cell of the plurality of first SRAM cells is electrically connected to a write-assist circuitry, wherein the write assist circuitry is configured to assist the write cycle capability of each cell of the plurality of first SRAM cells. Further, the write-assist circuitry comprises a negative voltage generator which is electrically connected to the bit-line and the bit-line bar of each cell of the plurality of first SRAM cells. Further, during a write cycle of the embedded SRAM chip, the bit-line is discharged to a low voltage (Vss) state, and the bit line bar is pre-charged to a high voltage (Vdd) state. Further, the negative voltage generator is configured to reduce the bit line voltage lower than the low voltage state, when the negative voltage generator is enabled. Further, each cell of the plurality of second SRAM cells do not include write assist circuitry; and a length ratio of X1 to Y1 is substantially larger than 2, and a length ratio of X2 to X1 is substantially larger than 1.15.

Yet another aspect of this description relates to an embedded synchronous random access memory (SRAM) chip, comprising a first single-port (SP) SRAM array and a second SP SRAM array. The first SRAM array comprises a plurality of first SRAM cells, wherein each cell of the plurality of first SRAM cells comprises a first cross-coupled inverter comprising a data storage node, and a second cross-coupled inverter comprising a data bar storage node; wherein each inverter comprises a P-type single FinFET transistor (PU); an N-type single FinFET transistor (PD); a first pass-gate (PG) transistor; a second PG transistor, wherein each PG transistor is an N-type single FinFET transistor; a first CVdd line, wherein the first CVdd line is electrically connected to a first power supply; a CVss lines; a bit-line; a bit-line bar; a word-line; a first shape comprises a first X-pitch (X1), and a first Y-pitch (Y1). The second SRAM array comprises a plurality of second SRAM cells, wherein each cell of the plurality of second SRAM cells comprises a third cross-coupled inverter comprising a data storage node; and a fourth cross-coupled inverter comprising a data bar storage node; wherein each inverter comprises a P-type single FinFET transistor (PU), and an N-type (PD) transistor, wherein the PD transistor comprises at least two FinFET transistors electrically connected in a parallel configuration; a third PG transistor, and a fourth PG transistor; wherein each of the third PG transistor and the fourth PG transistor comprise at least two FinFET transistors electrically connected in a parallel configuration; a second CVdd line, wherein the second CVdd line is electrically connected to a second power supply, wherein the first power supply is configured to provide a voltage greater than the second power supply by at least 40 millivolts (mV); a CVss lines; a bit-line; a bit-line bar; a word-line; a second shape comprises a second X-pitch (X2), and a second Y-pitch (Y2). Further, each cell of the plurality of first SRAM cells is electrically connected to a write-assist circuitry, wherein the write assist circuitry is configured to assist the write cycle capability of each cell of the plurality of first SRAM cells. Further, the write-assist circuitry comprises a negative voltage generator which is electrically connected to the bit-line and the bit-line bar of each cell of the plurality of first SRAM cells. Further, during a write cycle of the embedded SRAM chip, the bit-line is discharged to a low voltage (Vss) state, and the bit line bar is pre-charged to a high voltage (Vdd) state; and the negative voltage generator is configured to reduce the bit line voltage lower than the low voltage state, when the negative voltage generator is enabled. Further, each cell of the plurality of second SRAM cells do not include write assist circuitry; and a length ratio of X1 to Y1 is substantially larger than 2, and a length ratio of X2 to X1 is substantially larger than 1.15.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An embedded synchronous random access memory (SRAM) chip, comprising:
    a first single-port (SP) SRAM macro, wherein the first macro comprises:
    a first periphery circuit, and
    a plurality of first SRAM cells, wherein each cell of the plurality of first SRAM cells comprises:
    a first cross-coupled inverter comprising a data storage node, and
    a second cross-coupled inverter comprising a data bar storage node;
    wherein each inverter comprises:
    a P-type single FinFET transistor (PU);
    an N-type single FinFET transistor (PD);
    a first pass-gate (PG) transistor;
    a second PG transistor, wherein each PG transistor is an N-type single FinFET transistor;
    a CVdd line;
    a CVss line;
    a bit-line;
    a bit-line bar;
    a word-line; and
    a shape of each cell of the plurality of first SRAM cells is a first rectangular cell shape comprising:
    a first X-pitch (X1) extending in a first direction, and
    a first Y-pitch (Y1) extending in a second direction substantially perpendicular to the first direction;
    a second SP SRAM macro, wherein the second SP SRAM macro comprises:
    a second periphery circuit, and
    a plurality of second SRAM cells, wherein each cell of the plurality of second SRAM cells comprises:
    a third cross-coupled inverter comprising a data storage node; and
    a fourth cross-coupled inverter comprising a data bar storage node;
    wherein each inverter comprises:
    a P-type single FinFET transistor (PU), and
    an N-type (PD) transistor, wherein the PD transistor comprises at least two FinFET transistors electrically connected in a parallel configuration;
    a third PG transistor, and
    a fourth PG transistor; wherein each of the third PG transistor and the fourth PG transistor comprise at least two FinFET transistors electrically connected in a parallel configuration;
    a CVdd line;
    a CVss line;
    a bit-line;
    a bit-line bar;
    a word-line; and
    a shape of each cell of the plurality of second SRAM cells is a second rectangular cell shape comprising:
    a second X-pitch (X2) extending in the first direction, and
    a second Y-pitch (Y2) extending in the second direction;
    wherein each cell of the plurality of first SRAM cells is electrically connected to a write assist circuitry, wherein the write assist circuitry is configured to assist the write cycle capability of each cell of the plurality of first SRAM cells;
    wherein at least one cell of the plurality of second SRAM cells is not electrically connected to the write assist circuitry; and
    wherein a length ratio of X1 to Y1 is substantially larger than 2, a dimension ratio of Y1 to Y2 are substantially the same, and a length ratio of X2 to X1 is substantially larger than 1.15.

2. The embedded SRAM chip of claim 1, wherein a cell pitch ratio of X2 to Y1 is substantially equal to 2.8; and
    a length ratio of X2 to X1 is substantially equal to 1.235.

3. The embedded SRAM chip of claim 1, wherein the write-assist circuitry comprises a negative voltage generator which is electrically connected to the bit-line and the bit-line bar of each cell of the plurality of first SRAM cells;
    wherein during a write cycle of the embedded SRAM chip, the bit-line is discharged to a logically low voltage state, and the bit line bar is pre-charged to a logically high voltage state; and
    the negative voltage generator is configured to reduce the bit line voltage lower than the low voltage state, when the negative voltage generator is enabled.

4. The embedded SRAM chip of claim 1, further comprising:
    a first metal layer; and
    a second metal layer, wherein the second metal layer is located above the first metal layer;
    wherein each cell of the plurality of first SRAM cells further comprises:
    a first CVdd line;
    a first CVss line;
    a second CVss line;
    a first bit-line;
    a first bit-line bar, wherein the first CVdd line, the first bit-line and the first bit-line bar are each located at the first metal layer, and
    a first word-line; wherein the first CVss line, the second CVss line and the first word-line are each located at the second metal layer;
    wherein each cell of the plurality of second SRAM cells further comprises:
    a second CVdd line;
    a third CVss line;
    a fourth CVss line;
    a second bit-line;
    a second bit-line bar, wherein the second CVdd line, the second bit-line and the second bit-line bar are each located at the first metal layer, and a second word line, wherein the third CVss line, the fourth Vss line and the second word-line are each located at the second metal layer.

5. The embedded SRAM chip of claim 4, further comprising a third metal layer, wherein the third metal layer is located above the second metal layer; and wherein each cell of the plurality of second SRAM cells further comprises a third word-line, wherein the second word line is electrically connected to the third word line.

6. The embedded SRAM chip of claim 1, further comprising:
a first metal layer; and
a second metal layer, wherein the second metal layer is located above the first metal layer;
wherein each cell of the plurality of first SRAM cells further comprises:
a first CVdd line;
a first CVss line;
a second CVss line;
a first bit-line;
a first bit-line bar, wherein the first CVdd line, the first bit-line and the first bit-line bar are each located at the first metal layer, and
a first word-line; wherein the first CVss line, the second CVss line and the first word-line are each located at the second metal layer;
wherein each cell of the plurality of second SRAM cells further comprises:
a second CVdd line;
a third CVss line;
a fourth CVss line;
a fifth CVSS line located against a cell boundary and shared with an adjacent cell, wherein a cell boundary is between two adjacent cells;
a second bit-line;
a second bit-line bar, wherein the second CVdd line, the third CVss line, the fourth Vss line, the second bit-line and the second bit-line bar are each located at the first metal layer, and
a second word line, wherein the fifth CVss line and the second word-line are each located at the second metal layer.

7. The embedded SRAM chip of claim 1, wherein the write assist circuitry comprises a column based voltage control circuitry which is connected to the cell CVdd line;
wherein during a write operation of a selected memory cell, the voltage control circuitry is configured to reduce a voltage of the CVdd line of the selected cell by a predetermined voltage, wherein the predetermined voltage ranges from 50 millivolts (mV) to 600 mV.

8. The embedded SRAM chip of claim 7, wherein the voltage control circuitry comprises:
one voltage input node, wherein the voltage input node is electrically connected to an SRAM periphery Vdd power line;
one voltage output node, wherein the voltage output node is electrically connected to one of CVdd line; and
one enable input node, wherein the enable input node comprises:
a write cycle, wherein the voltage output node is configured to provide a lower voltage than an input voltage; and
a read cycle, wherein the voltage output node is configured to provide a substantially equal voltage as the input voltage or is configured to provide a higher voltage than the input voltage.

9. The embedded SRAM chip of claim 1, wherein the PD transistor of each cell of the plurality of first SRAM cells comprises a first channel width, and
the PD transistor of each cell of the plurality of second SRAM cells comprises a second channel width; wherein the first channel width is wider than the second channel width by at least 10%.

10. The embedded SRAM chip of claim 1, wherein the first periphery circuit comprises:
a first write driver;
a first sense amplifier; and
a write assist circuit,
and, wherein the second periphery circuit comprises:
a second write driver; and
a second sense amplifier.

11. An embedded synchronous random access memory (SRAM) chip, comprising:
a first single-port (SP) SRAM macro, wherein the first macro comprises:
a first periphery circuit, and
a plurality of first SRAM cells, wherein each cell of the plurality of first SRAM cells comprises:
a first cross-coupled inverter comprising a data storage node, and
a second cross-coupled inverter comprising a data bar storage node;
wherein each inverter comprises:
a P-type single FinFET transistor (PU);
an N-type single FinFET transistor (PD);
a first pass-gate (PG) transistor;
a second PG transistor, wherein each PG transistor is an N-type single FinFET transistor;
a CVdd line;
a CVss line;
a bit-line;
a bit-line bar;
a word-line; and
a first shape comprises comprising:
a first X-pitch (X1) extending in a first direction, and
a first Y-pitch (Y1) extending in a second direction substantially perpendicular to the first direction;
a second SP SRAM macro, wherein the second SP SRAM macro comprises:
a second periphery circuit, and
a plurality of second SRAM cells, wherein each cell of the plurality of second SRAM cells comprises:
a third cross-coupled inverter comprising a data storage node; and
a fourth cross-coupled inverter comprising a data bar storage node;
wherein each inverter comprises:
a P-type single FinFET transistor (PU), and
an N-type (PD) transistor, wherein the PD transistor comprises at least two FinFET transistors electrically connected in a parallel configuration;
a third PG transistor, and
a fourth PG transistor; wherein each of the third PG transistor and the fourth PG transistor comprise at least two FinFET transistors electrically connected in a parallel configuration;
a CVdd line;
a CVss line;
a bit-line;
a bit-line bar;
a word-line; and
a second shape comprising:
a second X-pitch (X2) extending in the first direction, and a second Y-pitch (Y2) extending in the second direction;
wherein each cell of the plurality of first SRAM cells is electrically connected to a write assist circuitry, wherein the write assist circuitry is configured to assist the write cycle capability of each cell of the plurality of first SRAM cells;
wherein the write assist circuitry comprises a negative voltage generator which is electrically connected to the bit-line and the bit-line bar of each cell of the plurality of first SRAM cells;
wherein during a write cycle of the embedded SRAM chip, the bit-line is discharged to a low voltage (Vss) state, and the bit line bar is pre-charged to a high voltage (Vdd) state; and
wherein the negative voltage generator is configured to reduce the bit line voltage lower than the low voltage state, when the negative voltage generator is enabled;
wherein at least one cell each cell of the plurality of second SRAM cells is not electrically connected to the write assist circuitry; and
wherein a length ratio of X1 to Y1 is substantially larger than 2, and a length ratio of X2 to X1 is substantially larger than 1.15.

12. The embedded SRAM chip of claim 11, wherein a cell pitch ratio of X2 to Y1 is substantially equal to 2.8; and
a length ratio of X2 to X1 is substantially equal to 1.235.

13. The embedded SRAM chip of claim 11, further comprising:
a first metal layer; and
a second metal layer, wherein the second metal layer is located above the first metal layer;
wherein each cell of the plurality of first SRAM cells further comprises:
a first CVdd line;
a first CVss line;
a second CVss line;
a first bit-line;
a first bit-line bar, wherein the first CVdd line, the first bit-line and the first bit-line bar are each located at the first metal layer, and
a first word-line; wherein the first CVss line, the second CVss line and the first word-line are each located at the second metal layer;
wherein each cell of the plurality of second SRAM cells further comprises:
a second CVdd line;
a third CVss line;
a fourth CVss line;
a second bit-line;
a second bit-line bar, wherein the second CVdd line, the second bit-line and the second bit-line bar are each located at the first metal layer, and
a second word line, wherein the third CVss line, the fourth Vss line and the second word-line are each located at the second metal layer.

14. The embedded SRAM chip of claim 13, further comprising a third metal layer, wherein the third metal layer is located above the second metal layer; and wherein each cell of the plurality of second SRAM cells further comprises a third word-line, wherein the second word line is electrically connected to the third word line.

15. An embedded synchronous random access memory (SRAM) chip, comprising:
a first single-port (SP) SRAM array, wherein the first SRAM array comprises a plurality of first SRAM cells, wherein each cell of the plurality of first SRAM cells comprises:
a first cross-coupled inverter comprising a data storage node, and
a second cross-coupled inverter comprising a data bar storage node;
wherein each inverter comprises:
a P-type single FinFET transistor (PU);
an N-type single FinFET transistor (PD);
a first pass-gate (PG) transistor;
a second PG transistor, wherein each PG transistor is an N-type single FinFET transistor;
a first CVdd line, wherein the first CVdd line is electrically connected to a first power supply;
a CVss line;
a bit-line;
a bit-line bar;
a word-line; and
a first shape comprising:
a first X-pitch (X1) extending in a first direction, and
a first Y-pitch (Y1) extending in a second direction substantially perpendicular to the first direction;
a second SP SRAM array, wherein the second SRAM array comprises a plurality of second SRAM cells, wherein each cell of the plurality of second SRAM cells comprises:
a third cross-coupled inverter comprising a data storage node; and
a fourth cross-coupled inverter comprising a data bar storage node;
wherein each inverter comprises:
a P-type single FinFET transistor (PU), and
an N-type (PD) transistor, wherein the PD transistor comprises at least two FinFET transistors electrically connected in a parallel configuration;
a third PG transistor, and
a fourth PG transistor; wherein each of the third PG transistor and the fourth PG transistor comprise at least two FinFET transistors electrically connected in a parallel configuration;
a second CVdd line, wherein the second CVdd line is electrically connected to a second power supply, wherein the first power supply is configured to provide a voltage greater than the second power supply by at least 40 millivolts (mV);
a CVss line;
a bit-line;
a bit-line bar;
a word-line; and
a second shape comprising:
a second X-pitch (X2) extending in the first direction, and
a second Y-pitch (Y2) extending in the second direction;
wherein each cell of the plurality of first SRAM cells is electrically connected to a write assist circuitry, wherein the write assist circuitry is configured to assist the write cycle capability of each cell of the plurality of first SRAM cells;
wherein the write assist circuitry comprises a negative voltage generator which is electrically connected to the bit-line and the bit-line bar of each cell of the plurality of first SRAM cells;
wherein during a write cycle of the embedded SRAM chip, the bit-line is discharged to a logically low voltage state, and the bit line bar is pre-charged to a logically high voltage state; and
wherein the negative voltage generator is configured to reduce the bit line voltage lower than the low voltage state, when the negative voltage generator is enabled;

wherein at least one cell of the plurality of second SRAM cells is not electrically connected to the write assist circuitry; and wherein a length ratio of X1 to Y1 is substantially larger than 2, and a length ratio of X2 to X1 is substantially larger than 1.15.

16. The embedded SRAM chip of claim 15, wherein a threshold voltage of the PU transistors of each cell of the plurality of first SRAM cells is greater than a threshold voltage of the PU transistors of each cell of the plurality of second SRAM cells of at least 20 mV.

17. The embedded SRAM chip of claim 15, wherein the word line of each cell of the plurality of first SRAM cells is electrically connected to a first word line driver circuit, wherein the first word line driver circuit is electrically connected to the first power supply; and wherein the word line of each cell of the plurality of second SRAM cells is electrically connected to a second word line driver circuit, wherein the second word line driver circuit is electrically connected to the second power supply.

18. The embedded SRAM chip of claim 17, wherein the bit line of each cell of the plurality of first SRAM cells is electrically connected to the first word line driver circuit, wherein the first word line driver circuit is electrically connected to a third power supply; and wherein the bit line of each cell of the plurality of second SRAM cells is electrically connected to the second word line driver circuit, wherein the second word line driver circuit is electrically connected to a fourth power supply, wherein a voltage provided by the third power supply is substantially equal to the fourth power supply.

19. The embedded SRAM chip of claim 18, wherein a voltage provided by the second power supply is substantially equal to the third power supply and the fourth power supply.

20. The embedded SRAM chip of claim 15, further comprising:
a first metal layer; and
a second metal layer, wherein the second metal layer is located above the first metal layer;
wherein each cell of the plurality of first SRAM cells further comprises:
a first CVdd line;
a first CVss line;
a second CVss line;
a first bit-line;
a first bit-line bar, wherein the first CVdd line, the first bit-line and the first bit-line bar are each located at the first metal layer, and
a first word-line; wherein the first CVss line, the second CVss line and the first word-line are each located at the second metal layer;
wherein each cell of the plurality of second SRAM cells further comprises:
a second CVdd line;
a third CVss line;
a fourth CVss line;
a second bit-line;
a second bit-line bar, wherein the second CVdd line, the second bit-line and the second bit-line bar are each located at the first metal layer, and
a second word line, wherein the third CVss line, the fourth Vss line and the second word-line are each located at the second metal layer.

* * * * *